US008642246B2

(12) United States Patent
Kennedy et al.

(10) Patent No.: US 8,642,246 B2
(45) Date of Patent: Feb. 4, 2014

(54) COMPOSITIONS, COATINGS AND FILMS FOR TRI-LAYER PATTERNING APPLICATIONS AND METHODS OF PREPARATION THEREOF

(75) Inventors: Joseph Kennedy, San Jose, CA (US); Songyuan Xie, Newark, CA (US); Kim Do, Campbell, CA (US); Sudip Mukhopadhyay, Berkeley, CA (US)

(73) Assignee: Honeywell International Inc., Morristown, NJ (US)

( * ) Notice: Subject to any disclaimer, the term of this patent is extended or adjusted under 35 U.S.C. 154(b) by 770 days.

(21) Appl. No.: 11/838,854

(22) Filed: Aug. 14, 2007

(65) Prior Publication Data
US 2008/0206690 A1    Aug. 28, 2008

Related U.S. Application Data

(60) Provisional application No. 60/903,466, filed on Feb. 26, 2007, provisional application No. 60/949,392, filed on Jul. 12, 2007.

(51) Int. Cl.
G03F 7/075    (2006.01)
G03F 7/11    (2006.01)
C08L 83/06    (2006.01)

(52) U.S. Cl.
CPC ............... G03F 7/0752 (2013.01); G03F 7/11 (2013.01); C08L 83/06 (2013.01)
USPC .......... 430/272.1; 430/270.1; 528/31; 528/43

(58) Field of Classification Search
CPC ....... G08F 7/004; G08F 7/0752; C08G 77/20; C08L 83/06
USPC .......... 430/270.1, 512, 287.1, 272.1; 528/32, 528/43
See application file for complete search history.

(56) References Cited

U.S. PATENT DOCUMENTS

| | | |
|---|---|---|
| 3,615,272 A | 10/1971 | Collins et al. |
| 3,635,529 A | 1/1972 | Nass |
| 3,784,378 A | 1/1974 | Gramas |
| 3,817,902 A | 6/1974 | Gomyo et al. |
| 3,873,361 A | 3/1975 | Franco et al. |
| 3,884,702 A | 5/1975 | Koshimo et al. |
| 4,053,313 A | 10/1977 | Fan |
| 4,191,571 A | 3/1980 | Nonogaki et al. |
| 4,257,826 A | 3/1981 | Matalone, Jr. |
| 4,290,896 A | 9/1981 | Gordon et al. |
| 4,299,938 A | 11/1981 | Green et al. |
| 4,308,371 A | 12/1981 | Tanaka et al. |
| 4,312,970 A | 1/1982 | Gaul, Jr. |
| 4,328,262 A | 5/1982 | Kurahashi et al. |
| 4,349,609 A | 9/1982 | Takeda et al. |
| 4,388,449 A | 6/1983 | Bonnet et al. |
| 4,399,255 A | 8/1983 | Smith et al. |
| 4,413,052 A | 11/1983 | Green et al. |
| 4,419,437 A | 12/1983 | Noonan et al. |
| 4,423,135 A | 12/1983 | Chen et al. |
| 4,430,153 A | 2/1984 | Gleason et al. |
| 4,434,127 A | 2/1984 | Baile |
| 4,483,107 A | 11/1984 | Tomoyori et al. |
| 4,510,283 A | 4/1985 | Takeda et al. |
| 4,513,132 A | 4/1985 | Shoji et al. |
| 4,515,828 A | 5/1985 | Economy et al. |
| 4,546,017 A | 10/1985 | Flackett et al. |
| 4,563,241 A | 1/1986 | Tanaka et al. |
| 4,587,138 A | 5/1986 | Yau et al. |
| 4,595,599 A | 6/1986 | Brown et al. |
| 4,600,685 A | 7/1986 | Kitakohji et al. |

(Continued)

FOREIGN PATENT DOCUMENTS

| | | |
|---|---|---|
| EP | 0144880 A2 | 11/1984 |
| EP | 0146411 A2 | 12/1984 |

(Continued)

OTHER PUBLICATIONS

U.S. Appl. No. 90/008,360, Shipley Company, L.L.C.
Crivello et al., J. Polym. Sci.: Polym. Chem. 21 (1983), 97-109.
Degussa, "Silanes for Adhesives and Sealants," 18-19, available at www.dynasylan.com.
Lamola, A. et al., "Chemically Amplified Resists," Solid State Technology, 53-60 (Aug. 1991).
Y.-C. Lin et al., "Some Aspects of Anti-Reflective Coating for Optical Lithography," Advances in Resist Technology and Processing, Proc., SPIE vol. 469, 30-37 (1984).
McKean et al., "Characterization of a Novolac-Based Three-Component Deep-UV Resist," Chem. Mater. (1990) 2, 619-624.

(Continued)

Primary Examiner — John Chu
(74) Attorney, Agent, or Firm — Sandra P. Thompson; Buchalter Nemer

(57) ABSTRACT

Compositions for use in tri-layer applications are described herein, wherein the composition has a matrix and includes: a formulated polymer comprising at least one type of silicon-based moiety forming the matrix of the polymer, a plurality of vinyl groups coupled to the matrix of the polymer, and a plurality of phenyl groups coupled to the matrix of the polymer, at least one condensation catalyst, and at least one solvent. Tri-layer structures are also contemplated herein that comprise an organic underlayer (first layer), antireflective compositions and/or films contemplated herein (second layer) and a photoresist material (third layer) that are coupled to one another. Methods of producing a composition for tri-layer patterning applications includes: providing a formulated polymer comprising at least one type of silicon-based moiety forming the matrix of the polymer, a plurality of vinyl groups coupled to the matrix of the polymer, and a plurality of phenyl groups coupled to the matrix of the polymer, providing at least one condensation catalyst, providing at least one solvent, providing at least one pH modifier, blending the formulated polymer and part of the at least one solvent in a reaction vessel to form a reactive mixture; and incorporating the at least one pH modifier, the at least one condensation catalyst and the remaining at least one solvent into the reactive mixture to form the composition.

24 Claims, 5 Drawing Sheets

(56) References Cited

U.S. PATENT DOCUMENTS

| | | |
|---|---|---|
| 4,603,168 A | 7/1986 | Sasaki et al. |
| 4,617,252 A | 10/1986 | Cordes, III et al. |
| 4,620,986 A | 11/1986 | Yau et al. |
| 4,626,556 A * | 12/1986 | Nozue et al. .................... 522/99 |
| 4,657,843 A | 4/1987 | Fukuyama et al. |
| 4,657,965 A | 4/1987 | Watanabe et al. |
| 4,663,414 A | 5/1987 | Estes et al. |
| 4,670,299 A | 6/1987 | Fukuyama et al. |
| 4,676,867 A | 6/1987 | Elkins et al. |
| 4,687,216 A | 8/1987 | Kawamoto et al. |
| 4,702,990 A | 10/1987 | Tanaka et al. |
| 4,723,978 A | 2/1988 | Clodgo et al. |
| 4,745,169 A | 5/1988 | Sugiyama et al. |
| 4,753,855 A | 6/1988 | Haluska et al. |
| 4,756,977 A | 7/1988 | Haluska et al. |
| 4,806,504 A | 2/1989 | Cleeves |
| 4,808,653 A | 2/1989 | Haluska et al. |
| 4,816,049 A | 3/1989 | Hata et al. |
| 4,822,697 A | 4/1989 | Haluska et al. |
| 4,822,718 A | 4/1989 | Latham et al. |
| 4,826,943 A | 5/1989 | Ito et al. |
| 4,831,188 A | 5/1989 | Neckers |
| 4,839,274 A | 6/1989 | Logan |
| 4,847,152 A | 7/1989 | Jabs et al. |
| 4,849,296 A | 7/1989 | Haluska et al. |
| 4,855,199 A | 8/1989 | Bolon et al. |
| 4,863,827 A | 9/1989 | Jain et al. |
| 4,863,829 A | 9/1989 | Furuta et al. |
| 4,863,833 A | 9/1989 | Fukuyama et al. |
| 4,876,165 A | 10/1989 | Brewer et al. |
| 4,885,262 A | 12/1989 | Ting et al. |
| 4,895,914 A | 1/1990 | Saitoh et al. |
| 4,898,907 A | 2/1990 | Haluska et al. |
| 4,904,721 A | 2/1990 | Hanaoka et al. |
| 4,910,122 A | 3/1990 | Arnold et al. |
| 4,910,255 A * | 3/1990 | Wakabayashi et al. ....... 525/100 |
| 4,911,992 A | 3/1990 | Haluska et al. |
| 4,913,846 A | 4/1990 | Suzuki et al. |
| 4,921,317 A | 5/1990 | Suzuki et al. |
| 4,921,778 A | 5/1990 | Thackeray et al. |
| 4,923,638 A | 5/1990 | Ohno et al. |
| 4,925,772 A | 5/1990 | Quella et al. |
| 4,927,732 A | 5/1990 | Merrem et al. |
| 4,935,320 A | 6/1990 | Rohde et al. |
| 4,935,583 A | 6/1990 | Kyle |
| 4,940,651 A | 7/1990 | Brown et al. |
| 4,942,083 A | 7/1990 | Smith, Jr. |
| 4,943,511 A | 7/1990 | Lazarus et al. |
| 4,950,583 A | 8/1990 | Brewer et al. |
| 4,954,414 A | 9/1990 | Adair et al. |
| 4,970,134 A | 11/1990 | Bronstert et al. |
| 4,973,510 A | 11/1990 | Tanaka |
| 4,973,526 A | 11/1990 | Haluska |
| 4,981,530 A | 1/1991 | Clodgo et al. |
| 4,988,514 A | 1/1991 | Fukuyama et al. |
| 4,999,397 A | 3/1991 | Weiss et al. |
| 5,004,660 A | 4/1991 | Van Andel et al. |
| 5,008,320 A | 4/1991 | Haluska et al. |
| 5,009,669 A | 4/1991 | Jollenbeck et al. |
| 5,009,809 A | 4/1991 | Kosin et al. |
| 5,009,810 A | 4/1991 | Wason et al. |
| 5,013,608 A | 5/1991 | Guest et al. |
| 5,024,823 A | 6/1991 | Gokcek |
| 5,026,624 A | 6/1991 | Day et al. |
| 5,034,189 A | 7/1991 | Cox et al. |
| 5,037,580 A | 8/1991 | Garcia et al. |
| 5,043,789 A | 8/1991 | Linde et al. |
| 5,045,570 A | 9/1991 | Mooney et al. |
| 5,045,592 A | 9/1991 | Weiss et al. |
| 5,049,414 A | 9/1991 | Kato |
| 5,055,372 A | 10/1991 | Shanklin et al. |
| 5,055,376 A | 10/1991 | Saeva |
| 5,059,448 A | 10/1991 | Chandra et al. |
| 5,059,500 A | 10/1991 | Needham et al. |
| 5,063,134 A | 11/1991 | Horiguchi et al. |
| 5,063,267 A | 11/1991 | Hanneman et al. |
| 5,077,085 A | 12/1991 | Schnur et al. |
| 5,079,600 A | 1/1992 | Schnur et al. |
| 5,100,503 A | 3/1992 | Allman et al. |
| 5,102,695 A | 4/1992 | Guest et al. |
| 5,104,692 A | 4/1992 | Belmares |
| 5,106,534 A | 4/1992 | Wason et al. |
| 5,112,728 A | 5/1992 | Tanji et al. |
| 5,116,715 A | 5/1992 | Roland et al. |
| 5,126,289 A | 6/1992 | Ziger |
| 5,137,655 A | 8/1992 | Kosin et al. |
| 5,140,396 A | 8/1992 | Needham et al. |
| 5,152,834 A | 10/1992 | Allman |
| 5,153,254 A | 10/1992 | Chen |
| 5,166,093 A | 11/1992 | Grief |
| 5,173,368 A | 12/1992 | Belmares |
| 5,194,364 A | 3/1993 | Abe et al. |
| 5,198,518 A | 3/1993 | Yamamoto et al. |
| 5,199,979 A | 4/1993 | Lin et al. |
| 5,212,046 A | 5/1993 | Lamola et al. |
| 5,212,218 A | 5/1993 | Rinehart |
| 5,219,788 A | 6/1993 | Abernathey et al. |
| 5,239,723 A | 8/1993 | Chen |
| 5,250,224 A | 10/1993 | Wason et al. |
| 5,252,340 A | 10/1993 | Honeycutt |
| 5,252,618 A | 10/1993 | Garcia et al. |
| 5,256,510 A | 10/1993 | Bugner et al. |
| 5,262,201 A | 11/1993 | Chandra et al. |
| 5,262,468 A | 11/1993 | Chen |
| 5,272,026 A | 12/1993 | Roland et al. |
| 5,272,042 A | 12/1993 | Allen et al. |
| 5,278,010 A | 1/1994 | Day et al. |
| 5,300,402 A | 4/1994 | Card, Jr. et al. |
| 5,302,198 A | 4/1994 | Allman |
| 5,302,455 A | 4/1994 | Wason et al. |
| 5,302,849 A | 4/1994 | Cavasin |
| 5,317,044 A | 5/1994 | Mooney et al. |
| 5,324,222 A | 6/1994 | Chen |
| 5,324,591 A | 6/1994 | Georger, Jr. et al. |
| 5,328,975 A | 7/1994 | Hanson et al. |
| 5,334,646 A | 8/1994 | Chen |
| 5,336,708 A | 8/1994 | Chen |
| 5,359,022 A | 10/1994 | Mautner et al. |
| 5,360,692 A | 11/1994 | Kawabe et al. |
| 5,380,621 A | 1/1995 | Dichiara et al. |
| 5,382,615 A | 1/1995 | Godfrey |
| 5,384,357 A | 1/1995 | Levinson et al. |
| 5,389,496 A | 2/1995 | Calvert et al. |
| 5,391,463 A | 2/1995 | Ligler et al. |
| 5,395,734 A | 3/1995 | Vogel et al. |
| 5,396,311 A | 3/1995 | Fukushima et al. |
| 5,401,614 A | 3/1995 | Dichiara et al. |
| 5,403,680 A | 4/1995 | Otagawa et al. |
| 5,414,069 A | 5/1995 | Cumming et al. |
| 5,417,977 A | 5/1995 | Honeycutt |
| 5,418,136 A | 5/1995 | Miller et al. |
| 5,432,007 A | 7/1995 | Naito |
| 5,439,766 A | 8/1995 | Day et al. |
| 5,439,872 A | 8/1995 | Ito et al. |
| 5,449,639 A | 9/1995 | Wei et al. |
| 5,449,712 A | 9/1995 | Gierke et al. |
| 5,455,145 A | 10/1995 | Tarumoto |
| 5,455,208 A | 10/1995 | Leung et al. |
| 5,457,081 A | 10/1995 | Takiguchi et al. |
| 5,458,982 A | 10/1995 | Godfrey |
| 5,467,626 A | 11/1995 | Sanders |
| 5,468,591 A | 11/1995 | Pearce et al. |
| 5,472,488 A | 12/1995 | Allman |
| 5,474,890 A | 12/1995 | Di Virgilio et al. |
| 5,482,817 A | 1/1996 | Dichiara et al. |
| 5,498,345 A | 3/1996 | Jollenbeck et al. |
| 5,498,468 A | 3/1996 | Blaney |
| 5,498,748 A | 3/1996 | Urano et al. |
| 5,500,315 A | 3/1996 | Calvert et al. |
| 5,508,334 A | 4/1996 | Chen |
| 5,510,628 A | 4/1996 | Georger, Jr. et al. |
| 5,512,418 A | 4/1996 | Ma |
| 5,518,818 A | 5/1996 | Kidai et al. |
| 5,520,855 A | 5/1996 | Ito et al. |

(56) References Cited

U.S. PATENT DOCUMENTS

| | | |
|---|---|---|
| 5,527,562 A | 6/1996 | Balaba et al. |
| 5,527,872 A | 6/1996 | Allman |
| 5,552,260 A | 9/1996 | Vogel et al. |
| 5,554,485 A | 9/1996 | Dichiara et al. |
| 5,576,144 A | 11/1996 | Pearce et al. |
| 5,576,247 A | 11/1996 | Yano et al. |
| 5,576,359 A | 11/1996 | Urano et al. |
| 5,578,318 A | 11/1996 | Honeycutt |
| 5,580,819 A | 12/1996 | Li et al. |
| 5,583,195 A | 12/1996 | Eckberg |
| 5,597,408 A | 1/1997 | Choi |
| 5,624,294 A | 4/1997 | Chen |
| 5,629,437 A | 5/1997 | Linder et al. |
| 5,638,724 A | 6/1997 | Sanders |
| 5,648,201 A | 7/1997 | Dulcey et al. |
| 5,655,947 A | 8/1997 | Chen |
| 5,661,196 A | 8/1997 | Mayer et al. |
| 5,661,992 A | 9/1997 | Sanders |
| 5,662,109 A | 9/1997 | Hutson |
| 5,663,286 A | 9/1997 | Ahmed et al. |
| 5,665,845 A | 9/1997 | Allman |
| 5,670,295 A | 9/1997 | Namba et al. |
| 5,672,243 A | 9/1997 | Hsia et al. |
| 5,674,624 A | 10/1997 | Miyazaki et al. |
| 5,674,648 A | 10/1997 | Brewer et al. |
| 5,677,112 A | 10/1997 | Urano et al. |
| 5,679,128 A | 10/1997 | Latting et al. |
| 5,683,095 A | 11/1997 | Astier et al. |
| 5,693,691 A | 12/1997 | Flaim et al. |
| 5,695,551 A | 12/1997 | Buckingham et al. |
| 5,695,910 A | 12/1997 | Urano et al. |
| 5,707,883 A | 1/1998 | Tabara |
| 5,719,249 A | 2/1998 | Fujita et al. |
| 5,729,563 A | 3/1998 | Wang et al. |
| 5,731,091 A | 3/1998 | Schmidt et al. |
| 5,738,976 A * | 4/1998 | Okinoshima et al. ...... 430/285.1 |
| 5,741,623 A | 4/1998 | Namba et al. |
| 5,744,243 A | 4/1998 | Li et al. |
| 5,747,223 A | 5/1998 | Allen et al. |
| 5,747,553 A | 5/1998 | Guzauskas |
| 5,750,292 A | 5/1998 | Sato et al. |
| 5,755,867 A | 5/1998 | Chikuni et al. |
| 5,756,257 A | 5/1998 | Landgrebe et al. |
| 5,759,625 A | 6/1998 | Laubacher et al. |
| 5,760,117 A | 6/1998 | Chen |
| 5,773,170 A | 6/1998 | Patel et al. |
| 5,780,206 A | 7/1998 | Urano et al. |
| 5,786,125 A | 7/1998 | Tsuchiya et al. |
| 5,800,926 A | 9/1998 | Nogami et al. |
| 5,840,821 A | 11/1998 | Nakano et al. |
| 5,843,617 A | 12/1998 | Patel et al. |
| 5,851,730 A | 12/1998 | Thackeray et al. |
| 5,851,738 A | 12/1998 | Thackeray et al. |
| 5,853,808 A * | 12/1998 | Arkles et al. ............... 427/377 |
| 5,855,960 A | 1/1999 | Ohnishi et al. |
| 5,868,597 A | 2/1999 | Chen |
| 5,873,931 A | 2/1999 | Scholz et al. |
| 5,883,011 A | 3/1999 | Lin et al. |
| 5,884,639 A | 3/1999 | Chen |
| 5,905,109 A | 5/1999 | Shimizu et al. |
| 5,910,021 A | 6/1999 | Tabara |
| 5,929,159 A | 7/1999 | Schutt et al. |
| 5,935,758 A | 8/1999 | Patel et al. |
| 5,939,236 A | 8/1999 | Pavelchek et al. |
| 5,939,510 A | 8/1999 | Sato et al. |
| 5,945,172 A | 8/1999 | Yamaya et al. |
| 5,945,249 A | 8/1999 | Patel et al. |
| 5,948,600 A | 9/1999 | Roschger et al. |
| 5,949,518 A | 9/1999 | Belmares et al. |
| 5,962,572 A | 10/1999 | Chen |
| 5,964,917 A | 10/1999 | Latting |
| 5,965,305 A | 10/1999 | Ligler et al. |
| 5,972,616 A | 10/1999 | O'Brien et al. |
| 5,976,666 A | 11/1999 | Narang et al. |
| 5,981,675 A | 11/1999 | Valint, Jr. et al. |
| 5,985,444 A | 11/1999 | Olson et al. |
| 5,986,344 A | 11/1999 | Subramanion et al. |
| 5,994,431 A | 11/1999 | Olson et al. |
| 5,997,621 A | 12/1999 | Scholz et al. |
| 5,998,300 A | 12/1999 | Tabara |
| 5,998,522 A | 12/1999 | Nakano et al. |
| 6,000,339 A | 12/1999 | Matsuzawa |
| 6,008,350 A | 12/1999 | Roschger et al. |
| 6,025,077 A | 2/2000 | Yamaki et al. |
| 6,033,283 A | 3/2000 | Chen |
| 6,040,053 A | 3/2000 | Scholz et al. |
| 6,040,251 A | 3/2000 | Caldwell |
| 6,043,547 A | 3/2000 | Hsia et al. |
| 6,050,871 A | 4/2000 | Chen |
| 6,051,310 A | 4/2000 | Cano et al. |
| 6,057,239 A | 5/2000 | Wang et al. |
| 6,072,018 A | 6/2000 | Wilkes et al. |
| 6,087,068 A | 7/2000 | Sato et al. |
| 6,096,460 A | 8/2000 | French et al. |
| 6,103,456 A | 8/2000 | Tobben et al. |
| 6,103,770 A | 8/2000 | Trouve |
| 6,107,167 A | 8/2000 | Bhakta |
| 6,117,176 A | 9/2000 | Chen |
| 6,124,369 A | 9/2000 | Kudo et al. |
| 6,137,175 A | 10/2000 | Tabara |
| 6,144,083 A | 11/2000 | Yin |
| 6,148,830 A | 11/2000 | Chen |
| 6,149,934 A | 11/2000 | Krzysik et al. |
| 6,150,250 A | 11/2000 | Tabara et al. |
| 6,150,440 A | 11/2000 | Olson et al. |
| 6,152,906 A | 11/2000 | Faulks et al. |
| 6,161,555 A | 12/2000 | Chen |
| 6,165,697 A | 12/2000 | Thackeray et al. |
| 6,166,163 A | 12/2000 | Kudo et al. |
| 6,171,766 B1 | 1/2001 | Patel et al. |
| 6,174,631 B1 | 1/2001 | French et al. |
| 6,174,977 B1 | 1/2001 | Ariyoshi et al. |
| 6,180,025 B1 | 1/2001 | Schoenfeld et al. |
| 6,180,317 B1 | 1/2001 | Allen et al. |
| 6,187,689 B1 | 2/2001 | Tabara |
| 6,190,830 B1 | 2/2001 | Leon et al. |
| 6,190,839 B1 | 2/2001 | Pavelchek et al. |
| 6,190,955 B1 | 2/2001 | Ilg et al. |
| 6,191,030 B1 | 2/2001 | Subramanian et al. |
| 6,194,121 B1 | 2/2001 | Namba et al. |
| 6,194,534 B1 | 2/2001 | Baumann et al. |
| 6,210,862 B1 | 4/2001 | Day et al. |
| 6,214,104 B1 | 4/2001 | Iida et al. |
| 6,217,890 B1 | 4/2001 | Paul et al. |
| 6,225,033 B1 | 5/2001 | Onishi et al. |
| 6,225,671 B1 | 5/2001 | Yin |
| 6,232,424 B1 | 5/2001 | Zhong et al. |
| 6,235,456 B1 | 5/2001 | Ibok |
| 6,238,379 B1 | 5/2001 | Keuhn, Jr. et al. |
| 6,238,838 B1 | 5/2001 | Gaschler et al. |
| 6,261,676 B1 | 7/2001 | Olson et al. |
| 6,261,743 B1 | 7/2001 | Pavelchek et al. |
| 6,268,108 B1 | 7/2001 | Iguchi et al. |
| 6,268,294 B1 | 7/2001 | Jang et al. |
| 6,268,457 B1 | 7/2001 | Kennedy et al. |
| 6,271,273 B1 | 8/2001 | You et al. |
| 6,277,750 B1 | 8/2001 | Pawlowski et al. |
| 6,280,911 B1 | 8/2001 | Trefonas, III |
| 6,284,428 B1 | 9/2001 | Hirosaki et al. |
| 6,287,286 B1 | 9/2001 | Akin et al. |
| 6,291,143 B1 | 9/2001 | Patel et al. |
| 6,291,586 B2 | 9/2001 | Lasch et al. |
| 6,296,862 B1 | 10/2001 | Paul et al. |
| 6,306,736 B1 | 10/2001 | Alivisatos et al. |
| 6,313,045 B1 | 11/2001 | Zhong et al. |
| 6,313,257 B1 | 11/2001 | Abbey |
| 6,315,946 B1 | 11/2001 | Focht |
| 6,316,013 B1 | 11/2001 | Paul et al. |
| 6,316,160 B1 | 11/2001 | Shao et al. |
| 6,316,165 B1 | 11/2001 | Pavelchek et al. |
| 6,323,268 B1 | 11/2001 | Fisher et al. |
| 6,324,703 B1 | 12/2001 | Chen |
| 6,326,231 B1 | 12/2001 | Subramanian et al. |
| 6,329,117 B1 | 12/2001 | Padmanaban et al. |

(56) References Cited

U.S. PATENT DOCUMENTS

| | | | |
|---|---|---|---|
| 6,329,118 | B1 | 12/2001 | Hussein et al. |
| 6,333,374 | B1 | 12/2001 | Chen |
| 6,335,234 | B2 | 1/2002 | Wu et al. |
| 6,343,249 | B1 | 1/2002 | Sakai et al. |
| 6,344,305 | B1 | 2/2002 | Lin et al. |
| 6,348,240 | B1 | 2/2002 | Calvert et al. |
| 6,350,818 | B1 | 2/2002 | Hong et al. |
| 6,352,931 | B1 | 3/2002 | Seta et al. |
| 6,358,294 | B1 | 3/2002 | Latting |
| 6,359,096 | B1 | 3/2002 | Zhong et al. |
| 6,365,529 | B1 | 4/2002 | Hussein et al. |
| 6,365,765 | B1 | 4/2002 | Baldwin et al. |
| 6,368,400 | B1 | 4/2002 | Baldwin et al. |
| 6,368,681 | B1 | 4/2002 | Ogawa |
| 6,374,738 | B1 | 4/2002 | Lewis et al. |
| 6,380,621 | B1 | 4/2002 | Ando et al. |
| 6,387,519 | B1 | 5/2002 | Anderson et al. |
| 6,391,524 | B2 | 5/2002 | Yates et al. |
| 6,399,269 | B2 | 6/2002 | Mizutani et al. |
| 6,403,464 | B1 | 6/2002 | Chang |
| 6,409,883 | B1 | 6/2002 | Makolin et al. |
| 6,410,150 | B1 | 6/2002 | Kurosawa et al. |
| 6,410,209 | B1 | 6/2002 | Adams et al. |
| 6,413,647 | B1 | 7/2002 | Hayashi et al. |
| 6,420,088 | B1 | 7/2002 | Angelopoulos et al. |
| 6,420,475 | B1 | 7/2002 | Chen |
| 6,426,125 | B1 | 7/2002 | Yang et al. |
| 6,432,191 | B2 | 8/2002 | Schutt |
| 6,433,037 | B1 | 8/2002 | Guzauskas |
| 6,441,452 | B2 | 8/2002 | Yin |
| 6,444,584 | B1 | 9/2002 | Hsiao |
| 6,448,185 | B1 | 9/2002 | Andideh et al. |
| 6,448,464 | B1 | 9/2002 | Akin et al. |
| 6,451,503 | B1 | 9/2002 | Thackeray et al. |
| 6,455,207 | B1 | 9/2002 | Katoh et al. |
| 6,455,416 | B1 | 9/2002 | Subramanian et al. |
| 6,461,970 | B1 | 10/2002 | Yin |
| 6,465,358 | B1 | 10/2002 | Nashner et al. |
| 6,465,889 | B1 | 10/2002 | Subramanian et al. |
| 6,472,012 | B2 | 10/2002 | Nakada et al. |
| 6,472,128 | B2 | 10/2002 | Thackeray et al. |
| 6,475,892 | B1 | 11/2002 | Bhakta |
| 6,488,394 | B1 | 12/2002 | Mabe et al. |
| 6,491,840 | B1 | 12/2002 | Frankenbach et al. |
| 6,492,441 | B2 | 12/2002 | Hong et al. |
| 6,495,264 | B2 | 12/2002 | Hayashi et al. |
| 6,497,893 | B1 | 12/2002 | Everhart et al. |
| 6,503,233 | B1 | 1/2003 | Chen et al. |
| 6,503,413 | B2 | 1/2003 | Uchiyama et al. |
| 6,503,526 | B1 | 1/2003 | Krzysik et al. |
| 6,503,586 | B1 | 1/2003 | Wu et al. |
| 6,503,692 | B2 | 1/2003 | Angelopoulos et al. |
| 6,504,525 | B1 | 1/2003 | Knights |
| 6,505,362 | B1 | 1/2003 | Scipio |
| 6,506,497 | B1 | 1/2003 | Kennedy et al. |
| 6,514,677 | B1 | 2/2003 | Ramsden et al. |
| 6,515,073 | B2 | 2/2003 | Sakamoto et al. |
| 6,528,235 | B2 | 3/2003 | Thackeray et al. |
| 6,541,107 | B1 | 4/2003 | Zhong et al. |
| 6,544,717 | B2 | 4/2003 | Hirosaki et al. |
| 6,552,109 | B1 | 4/2003 | Chen |
| 6,558,363 | B2 | 5/2003 | Keuhn, Jr. et al. |
| 6,558,880 | B1 | 5/2003 | Goswami et al. |
| 6,562,192 | B1 | 5/2003 | Hamilton et al. |
| 6,565,813 | B1 | 5/2003 | Garyantes |
| 6,566,479 | B1 | 5/2003 | Bublewitz et al. |
| 6,573,175 | B1 | 6/2003 | Yin et al. |
| 6,576,382 | B2 | 6/2003 | Day et al. |
| 6,576,408 | B2 | 6/2003 | Meador et al. |
| 6,576,651 | B2 | 6/2003 | Bandyopadhyay et al. |
| 6,582,861 | B2 | 6/2003 | Buxbaum et al. |
| 6,592,999 | B1 | 7/2003 | Anderson et al. |
| 6,593,388 | B2 | 7/2003 | Crivello |
| 6,596,314 | B2 | 7/2003 | Wong et al. |
| 6,596,467 | B2 | 7/2003 | Gallagher et al. |
| 6,602,652 | B2 | 8/2003 | Adams et al. |
| 6,605,359 | B2 * | 8/2003 | Robinson et al. ............. 428/447 |
| 6,605,360 | B2 | 8/2003 | Kizaki et al. |
| 6,605,362 | B2 | 8/2003 | Baldwin et al. |
| 6,605,542 | B2 | 8/2003 | Seta et al. |
| 6,610,457 | B2 | 8/2003 | Kim et al. |
| 6,612,828 | B2 | 9/2003 | Powers et al. |
| 6,613,834 | B2 | 9/2003 | Nakata et al. |
| 6,617,257 | B2 | 9/2003 | Ni et al. |
| 6,623,791 | B2 | 9/2003 | Sadvary et al. |
| 6,627,275 | B1 | 9/2003 | Chen |
| 6,632,535 | B1 | 10/2003 | Buazza et al. |
| 6,635,281 | B2 | 10/2003 | Wong et al. |
| 6,635,341 | B1 | 10/2003 | Barancyk et al. |
| 6,645,685 | B2 | 11/2003 | Takata et al. |
| 6,645,881 | B2 | 11/2003 | Yamada et al. |
| 6,649,212 | B2 | 11/2003 | Payne et al. |
| 6,649,741 | B1 | 11/2003 | O'Brien et al. |
| 6,652,766 | B1 | 11/2003 | Frankenbach et al. |
| 6,653,049 | B2 | 11/2003 | Pavelchek et al. |
| 6,655,946 | B2 | 12/2003 | Foreman et al. |
| 6,667,424 | B1 | 12/2003 | Hamilton et al. |
| 6,670,284 | B2 | 12/2003 | Yin |
| 6,673,982 | B1 | 1/2004 | Chen et al. |
| 6,676,398 | B2 | 1/2004 | Foreman et al. |
| 6,676,740 | B2 | 1/2004 | Matsumura et al. |
| 6,677,392 | B2 | 1/2004 | Ravichandran et al. |
| 6,689,932 | B2 | 2/2004 | Kruchoski et al. |
| 6,696,538 | B2 | 2/2004 | Ko et al. |
| 6,699,647 | B2 | 3/2004 | Lynch et al. |
| 6,702,564 | B2 | 3/2004 | Foreman et al. |
| 6,703,169 | B2 | 3/2004 | Fuller et al. |
| 6,703,462 | B2 | 3/2004 | Lee |
| 6,709,257 | B2 | 3/2004 | Foreman et al. |
| 6,712,331 | B2 | 3/2004 | Foreman et al. |
| 6,716,566 | B2 | 4/2004 | Aoshima |
| 6,717,181 | B2 | 4/2004 | Murakami et al. |
| 6,720,125 | B2 | 4/2004 | Nakamura et al. |
| 6,726,463 | B2 | 4/2004 | Foreman |
| 6,726,997 | B2 * | 4/2004 | Tamori et al. ................ 428/447 |
| 6,730,454 | B2 | 5/2004 | Pfeiffer et al. |
| 6,730,461 | B2 | 5/2004 | Hunt et al. |
| 6,737,121 | B2 | 5/2004 | Yang et al. |
| 6,740,685 | B2 | 5/2004 | Li et al. |
| 6,749,860 | B2 | 6/2004 | Tyrrell et al. |
| 6,752,613 | B2 | 6/2004 | Foreman |
| 6,756,103 | B2 | 6/2004 | Thompson et al. |
| 6,756,124 | B2 | 6/2004 | Kanamori et al. |
| 6,756,520 | B1 | 6/2004 | Krzysik et al. |
| 6,758,663 | B2 | 7/2004 | Foreman et al. |
| 6,767,689 | B2 | 7/2004 | Pavelchek et al. |
| 6,770,726 | B1 * | 8/2004 | Arkles et al. ................... 528/42 |
| 6,773,861 | B2 | 8/2004 | Takashima et al. |
| 6,773,864 | B1 | 8/2004 | Thackeray et al. |
| 6,776,094 | B1 | 8/2004 | Whitesides et al. |
| 6,777,092 | B1 | 8/2004 | Hayashi et al. |
| 6,783,468 | B2 | 8/2004 | Sullivan et al. |
| 6,787,281 | B2 | 9/2004 | Tao et al. |
| 6,790,024 | B2 | 9/2004 | Foreman |
| 6,794,440 | B2 | 9/2004 | Chen |
| 6,797,343 | B2 | 9/2004 | Lee |
| 6,797,453 | B2 * | 9/2004 | Shiraki et al. .............. 430/270.1 |
| 6,800,330 | B2 | 10/2004 | Hayashi et al. |
| 6,803,034 | B2 | 10/2004 | DuVal et al. |
| 6,803,168 | B1 | 10/2004 | Padmanaban et al. |
| 6,803,476 | B2 | 10/2004 | Rantala et al. |
| 6,808,381 | B2 | 10/2004 | Foreman et al. |
| 6,819,049 | B1 | 11/2004 | Bohmer et al. |
| 6,824,879 | B2 | 11/2004 | Baldwin et al. |
| 6,824,952 | B1 | 11/2004 | Minsek et al. |
| 6,825,303 | B2 | 11/2004 | Lee |
| 6,831,189 | B2 | 12/2004 | Rantala et al. |
| 6,832,064 | B2 | 12/2004 | Simpson et al. |
| 6,840,752 | B2 | 1/2005 | Foreman et al. |
| 6,844,131 | B2 | 1/2005 | Oberlander et al. |
| 6,846,614 | B2 | 1/2005 | Timpe et al. |
| 6,849,209 | B2 | 2/2005 | Minami et al. |
| 6,849,373 | B2 | 2/2005 | Pavelchek et al. |
| 6,849,923 | B2 | 2/2005 | Seta et al. |

(56) References Cited

U.S. PATENT DOCUMENTS

| | | | |
|---|---|---|---|
| 6,852,421 B2 | 2/2005 | Wayton et al. |
| 6,852,766 B1 | 2/2005 | DeVoe |
| 6,855,466 B2 | 2/2005 | Pavelchek et al. |
| 6,864,040 B2 | 3/2005 | Muller et al. |
| 6,867,253 B1 | 3/2005 | Chen |
| 6,869,747 B2 | 3/2005 | Sabnis et al. |
| 6,875,005 B2 | 4/2005 | Foreman |
| 6,884,568 B2 | 4/2005 | Timpe et al. |
| 6,887,644 B1 | 5/2005 | Nozaki et al. |
| 6,887,648 B2 | 5/2005 | Pavelchek et al. |
| 6,888,174 B2 | 5/2005 | Hohn et al. |
| 6,890,448 B2 | 5/2005 | Pavelchek |
| 6,890,605 B2 | 5/2005 | Nishikawa et al. |
| 6,890,865 B2 | 5/2005 | Yin et al. |
| 6,893,245 B2 | 5/2005 | Foreman et al. |
| 6,893,797 B2 | 5/2005 | Munnelly et al. |
| 6,896,821 B2 | 5/2005 | Louellet |
| 6,899,988 B2 | 5/2005 | Kidnie et al. |
| 6,900,000 B2 | 5/2005 | Sabnis et al. |
| 6,902,771 B2 | 6/2005 | Shiota et al. |
| 6,902,861 B2 | 6/2005 | Tao et al. |
| 6,908,722 B2 | 6/2005 | Ebata et al. |
| 6,909,220 B2 | 6/2005 | Chen |
| 6,911,514 B2 | 6/2005 | Bublewitz et al. |
| 6,914,114 B2 | 7/2005 | Baldwin et al. |
| 6,924,384 B2 | 8/2005 | Rantala et al. |
| 6,942,083 B2 | 9/2005 | Barnes et al. |
| 6,956,097 B2 | 10/2005 | Kennedy et al. |
| 6,974,970 B2 | 12/2005 | Rantala et al. |
| 7,012,125 B2 | 3/2006 | Kennedy et al. |
| 7,014,982 B2 | 3/2006 | Thackeray et al. |
| 7,026,053 B2 | 4/2006 | Shiota et al. |
| 7,026,427 B2 | 4/2006 | Koehler et al. |
| 7,060,634 B2 | 6/2006 | Rantala et al. |
| 7,074,874 B2 | 7/2006 | Kobayashi et al. |
| 7,081,272 B2 | 7/2006 | Sasaki et al. |
| 7,098,346 B2 | 8/2006 | Rantala et al. |
| 7,119,354 B2 | 10/2006 | Yagihashi et al. |
| 7,128,976 B2 | 10/2006 | Hayashi et al. |
| 7,132,473 B2 | 11/2006 | Ogihara et al. |
| 7,144,827 B2 | 12/2006 | Rantala et al. |
| 7,161,019 B2 | 1/2007 | Rantala et al. |
| 7,202,013 B2 | 4/2007 | Ogihara et al. |
| 7,651,776 B2* | 1/2010 | Yoshioka et al. ............ 428/447 |
| 2002/0031729 A1 | 3/2002 | Trefonas, III et al. |
| 2002/0034630 A1 | 3/2002 | Cano et al. |
| 2002/0095018 A1 | 7/2002 | Baldwin et al. |
| 2002/0102417 A1 | 8/2002 | Schutt et al. |
| 2002/0123592 A1 | 9/2002 | Zhang et al. |
| 2002/0127330 A1 | 9/2002 | Jin et al. |
| 2002/0128388 A1 | 9/2002 | Kennedy et al. |
| 2003/0003176 A1 | 1/2003 | Foreman et al. |
| 2003/0111748 A1 | 6/2003 | Foreman |
| 2003/0120018 A1 | 6/2003 | Baldwin et al. |
| 2003/0125430 A1 | 7/2003 | Adedeji et al. |
| 2003/0157391 A1 | 8/2003 | Coleman et al. |
| 2003/0171729 A1 | 9/2003 | Kaun et al. |
| 2003/0191269 A1 | 10/2003 | Ko et al. |
| 2003/0192638 A1 | 10/2003 | Yang et al. |
| 2003/0199633 A1 | 10/2003 | Leon et al. |
| 2003/0214042 A1 | 11/2003 | Miyazawa |
| 2003/0215737 A1* | 11/2003 | Shiraki et al. ............ 430/270.1 |
| 2003/0224611 A1 | 12/2003 | Seta et al. |
| 2003/0227021 A1 | 12/2003 | Yamazaki et al. |
| 2003/0235785 A1 | 12/2003 | Barclay et al. |
| 2004/0020689 A1 | 2/2004 | Kagami et al. |
| 2004/0067437 A1 | 4/2004 | Wayton et al. |
| 2004/0072420 A1 | 4/2004 | Enomoto et al. |
| 2004/0072436 A1 | 4/2004 | RamachandraRao et al. |
| 2004/0077757 A1 | 4/2004 | Araki et al. |
| 2004/0091811 A1 | 5/2004 | Munnelly et al. |
| 2004/0096666 A1 | 5/2004 | Knox et al. |
| 2004/0131979 A1 | 7/2004 | Li et al. |
| 2004/0161698 A1 | 8/2004 | Kanagasabapathy et al. |
| 2004/0166434 A1 | 8/2004 | Dammel et al. |
| 2004/0202874 A1 | 10/2004 | Iwabuchi et al. |
| 2004/0202956 A1* | 10/2004 | Takahashi et al. ......... 430/270.1 |
| 2004/0229158 A1 | 11/2004 | Meador et al. |
| 2004/0235971 A1 | 11/2004 | Hamada et al. |
| 2004/0247900 A1 | 12/2004 | Oglhara et al. |
| 2004/0253461 A1 | 12/2004 | Ogihara et al. |
| 2004/0253532 A1 | 12/2004 | Wu et al. |
| 2004/0253535 A1 | 12/2004 | Cameron et al. |
| 2005/0019842 A1 | 1/2005 | Prober et al. |
| 2005/0020837 A1 | 1/2005 | Doherty et al. |
| 2005/0026092 A1 | 2/2005 | Nagase |
| 2005/0032357 A1 | 2/2005 | Runtala et al. |
| 2005/0042538 A1 | 2/2005 | Babich et al. |
| 2005/0058929 A1 | 3/2005 | Kennedy et al. |
| 2005/0074689 A1 | 4/2005 | Angelopoulos et al. |
| 2005/0074981 A1 | 4/2005 | Meagley et al. |
| 2005/0077639 A1 | 4/2005 | Foreman et al. |
| 2005/0080214 A1 | 4/2005 | Shin et al. |
| 2005/0089642 A1 | 4/2005 | Adams et al. |
| 2005/0136268 A1 | 6/2005 | Shin et al. |
| 2005/0171277 A1 | 8/2005 | Li et al. |
| 2005/0225238 A1 | 10/2005 | Winters |
| 2005/0277756 A1 | 12/2005 | Iwabuchi et al. |
| 2006/0006541 A1 | 1/2006 | Tsuchiya et al. |
| 2006/0057801 A1 | 3/2006 | Rantala et al. |
| 2006/0085489 A1 | 4/2006 | Tomic et al. |
| 2006/0110682 A1 | 5/2006 | Thackeray et al. |
| 2006/0115766 A1* | 6/2006 | Suwa et al. ............... 430/270.1 |
| 2006/0127587 A1 | 6/2006 | Kang et al. |
| 2006/0131753 A1 | 6/2006 | Runtala et al. |
| 2006/0155594 A1 | 7/2006 | Almeida et al. |
| 2006/0258146 A1 | 11/2006 | Runtala et al. |
| 2006/0289849 A1 | 12/2006 | Yagihashi et al. |
| 2007/0088144 A1 | 4/2007 | Kang et al. |

FOREIGN PATENT DOCUMENTS

| | | |
|---|---|---|
| EP | 0204963 | 12/1986 |
| EP | 0323186 | 7/1989 |
| EP | 0184248 B1 | 8/1989 |
| EP | 229629 | 4/1991 |
| EP | 0423446 | 4/1991 |
| EP | 0427395 | 5/1991 |
| EP | 0449263 | 10/1991 |
| EP | 0217137 B1 | 4/1992 |
| EP | 0494744 A1 | 7/1992 |
| EP | 0159428 B1 | 11/1992 |
| EP | 0458651 B1 | 3/1994 |
| EP | 0401499 B1 | 12/1995 |
| EP | 0422570 B1 | 12/1995 |
| EP | 0727711 A2 | 8/1996 |
| EP | 0851300 A1 | 7/1998 |
| EP | 0881678 A2 | 12/1998 |
| EP | 0902067 A1 | 3/1999 |
| EP | 0911875 A2 | 4/1999 |
| EP | 0687004 B1 | 12/2002 |
| EP | 1829945 A1 | 9/2007 |
| EP | 0225676 B1 | 4/2009 |
| JP | 50022870 A | 7/1975 |
| JP | 53088099 A | 8/1978 |
| JP | 122596 | 10/1978 |
| JP | 53124561 | 10/1978 |
| JP | 54079037 A | 6/1979 |
| JP | 54083956 A | 7/1979 |
| JP | 55000761 A | 1/1980 |
| JP | 55-063335 | 5/1980 |
| JP | 55165942 A | 12/1980 |
| JP | 56000627 A | 1/1981 |
| JP | 56000828 | 1/1981 |
| JP | 56081333 A | 7/1981 |
| JP | 81028935 | 7/1981 |
| JP | 56118465 A | 9/1981 |
| JP | 56129261 | 10/1981 |
| JP | 56139533 | 10/1981 |
| JP | 56151731 A | 11/1981 |
| JP | 57008279 | 1/1982 |
| JP | 57038865 | 3/1982 |
| JP | 57059672 A | 4/1982 |
| JP | 57083563 A | 5/1982 |

(56) References Cited

FOREIGN PATENT DOCUMENTS

| | | |
|---|---|---|
| JP | 57112047 | 7/1982 |
| JP | 57125905 | 8/1982 |
| JP | 57131250 | 8/1982 |
| JP | 57141641 A | 9/1982 |
| JP | 57141642 | 9/1982 |
| JP | 57168246 | 10/1982 |
| JP | 57168247 | 10/1982 |
| JP | 58-003249 | 1/1983 |
| JP | 83007001 | 2/1983 |
| JP | 58-066335 | 4/1983 |
| JP | 58174480 | 10/1983 |
| JP | 59189126 | 10/1983 |
| JP | 59058054 A | 4/1984 |
| JP | 59109565 | 6/1984 |
| JP | 59112834 | 6/1984 |
| JP | 59132423 | 7/1984 |
| JP | 59190211 | 10/1984 |
| JP | 60042426 | 3/1985 |
| JP | 60076528 | 5/1985 |
| JP | 60086017 | 5/1985 |
| JP | 61108628 A | 5/1985 |
| JP | 60152552 | 8/1985 |
| JP | 60185892 A | 9/1985 |
| JP | 60195148 | 10/1985 |
| JP | 60254034 | 12/1985 |
| JP | 60254035 | 12/1985 |
| JP | 61014096 | 1/1986 |
| JP | 61098747 | 5/1986 |
| JP | 61127732 | 6/1986 |
| JP | 61221232 | 10/1986 |
| JP | 61224330 | 10/1986 |
| JP | 61246347 | 11/1986 |
| JP | 61260242 | 11/1986 |
| JP | 61-274497 | 12/1986 |
| JP | 62027417 | 2/1987 |
| JP | 62043426 | 2/1987 |
| JP | 62056956 | 3/1987 |
| JP | 62067561 | 3/1987 |
| JP | 62096942 | 5/1987 |
| JP | 59112487 A | 6/1987 |
| JP | 62161124 | 7/1987 |
| JP | 62215944 | 9/1987 |
| JP | 62275643 | 12/1987 |
| JP | 62299965 | 12/1987 |
| JP | 63005337 | 1/1988 |
| JP | 63006544 | 1/1988 |
| JP | 64001769 | 1/1988 |
| JP | 63046272 | 2/1988 |
| JP | 63072745 | 4/1988 |
| JP | 63106649 | 5/1988 |
| JP | 63117074 | 5/1988 |
| JP | 63118739 | 5/1988 |
| JP | 63120774 | 5/1988 |
| JP | 63-137437 | 6/1988 |
| JP | 63137972 | 6/1988 |
| JP | 63149636 | 6/1988 |
| JP | 63152130 | 6/1988 |
| JP | 63172757 | 7/1988 |
| JP | 63173382 | 7/1988 |
| JP | 63199251 | 8/1988 |
| JP | 63207829 | 8/1988 |
| JP | 63238133 | 10/1988 |
| JP | 63287823 | 11/1988 |
| JP | 63289045 | 11/1988 |
| JP | 63308077 | 12/1988 |
| JP | 64-028032 | 1/1989 |
| JP | 1016868 | 1/1989 |
| JP | 1038256 | 2/1989 |
| JP | 1056710 | 3/1989 |
| JP | 1075046 | 3/1989 |
| JP | 1110546 | 4/1989 |
| JP | 1115966 | 5/1989 |
| JP | 1168718 | 7/1989 |
| JP | 1185367 | 7/1989 |
| JP | 1203013 | 8/1989 |
| JP | 1204043 | 8/1989 |
| JP | 1204432 | 8/1989 |
| JP | 1207310 | 8/1989 |
| JP | 1217352 | 8/1989 |
| JP | 1245248 | 9/1989 |
| JP | 1308429 | 12/1989 |
| JP | 1313942 | 12/1989 |
| JP | 2000615 | 1/1990 |
| JP | 2008209 | 1/1990 |
| JP | 2038427 | 2/1990 |
| JP | 2099955 | 4/1990 |
| JP | 2110464 | 4/1990 |
| JP | 2124936 | 5/1990 |
| JP | 02-145511 | 6/1990 |
| JP | 2150426 | 6/1990 |
| JP | 2163744 | 6/1990 |
| JP | 2178330 | 7/1990 |
| JP | 2308806 | 12/1990 |
| JP | 3007766 | 1/1991 |
| JP | 3014456 | 1/1991 |
| JP | 3026716 | 2/1991 |
| JP | 3028852 | 2/1991 |
| JP | 3031325 | 2/1991 |
| JP | 3045628 | 2/1991 |
| JP | 3047883 | 2/1991 |
| JP | 03-050459 | 3/1991 |
| JP | 3059016 | 3/1991 |
| JP | 3064337 | 3/1991 |
| JP | 3064753 | 3/1991 |
| JP | 3152544 | 6/1991 |
| JP | 3154007 | 7/1991 |
| JP | 3162441 | 7/1991 |
| JP | 3197135 | 8/1991 |
| JP | 3200257 | 9/1991 |
| JP | 3207774 | 9/1991 |
| JP | 3209476 | 9/1991 |
| JP | 3252446 | 11/1991 |
| JP | 06056560 A | 3/1994 |
| JP | 6095385 A | 4/1994 |
| JP | 6129153 | 5/1994 |
| JP | 53000896 A | 1/1997 |
| JP | 9183853 A | 7/1997 |
| JP | 54083957 A | 7/1997 |
| JP | 10502461 T | 3/1998 |
| JP | 10161315 A | 6/1998 |
| JP | 2001092122 A | 6/2001 |
| JP | 2006241407 A | 9/2006 |
| WO | 9600758 | 1/1996 |
| WO | 00/31183 A1 | 6/2000 |
| WO | 00/77575 A1 | 12/2000 |
| WO | 0077575 A | 12/2000 |
| WO | 02/16477 A2 | 2/2002 |
| WO | 03/044078 A1 | 5/2003 |
| WO | 03/044600 A1 | 5/2003 |
| WO | 03/070809 A2 | 8/2003 |
| WO | 03/089992 A1 | 10/2003 |
| WO | WO 2005080629 | 9/2005 |

OTHER PUBLICATIONS

Nalamasu et al., "Development of a Chemically Amplified Positive (CAMP) Resist Material for Single Layer Deep-UV Lithography," Advances in Resist Technology and Processing VII, SPIE 1262, 32-41 (1990).

Silverstein et al., "Spectrometric Identification of Organic Compounds," 4th Ed. John Wiley & Sons 1991, 309-311.

Willson, C.G., "Organic Resist Materials—Theory and Chemistry," Introduction to Microlithography, American Chemical Society, 87-159 (1983).

Hawley's Condensed Chemical Dictionary, 11th ed., 85-86.

"HD Micro Puts Out Positive Polyamide," Electronic News, Jun. 19, 2000.

Jaskot et al., Toxicological Sciences, 22(1): 103-112 (1994).

Brewer, T. et al., "The Reduction of the Standing Wave Effect in Positive Photoresists," Jour. Appl. Photogr. Eng., vol. 7, No. 6, 184-186 (Dec. 1981).

Yuske Izumi, et al., "Hydrosilaytion of Carbonyl compounds Catalyzed by Solid Acids and Bases," (Tetrahedron Letters, vol. 32, No. 36, pp. 4744 (1991).

(56) References Cited

OTHER PUBLICATIONS

Singer, "Anti-Reflective Coatings: A Story of Interfaces", Semiconductor International, pp. 55-60 (Mar. 1999).
Lucas, et al., "Anti-reflective coating optimizing techniques for sub-0.2um geometries"< Motorola, Advanced Products, p. 171 SPIE 25th Annual Symposium on Microlithography, Feb. 27-Mar. 3, 2000.
Puppo, et al., "A novel organic resist removal and cleansing technology", p. 228, SPIE 25 th Annual Symposium on Microlithography, Feb. 27-Mar. 3, 2000.
Taylor, et al., "Methyacrylate Resists and Antireflective Coatings for 193 nm Lithography", p. 245, SPIE 25 th Annual Symposium on Microlithography, Feb, 27-Mar. 3, 2000.
Lin, et al., "Dual Layer inorganic SiON Bottom ARC for 0.25um DUV Hard Mask Applications", p. 246 SPIE 25 th Annual Symposium on Microlithography, Feb. 27-Mar. 3, 2000.
Yamanaka, et al., "Suppression of Resist pattern Deformation on SiON Bottom Anti-Reflective Layer for Deep UV Lithography", p. 247 SPIE 25 th Annual Symposium on Microlithography, Feb. 27-Mar. 3, 2000.
Padmanaban, "Bottom Anti-Reflective Coatings for ArF, KrF, and I-line Applications: A Comparison of Theory, Design and Lithographic Aspects", p. 281 SPIE 25 th Annual Symposium on Microlithography, Feb. 27-Mar. 3, 2000.
Onishi, "Application of polysilanes for deep UV antireflective coating", p. 248 SPIE 25 th Annual Symposium on Microlithography. Feb. 27-Mar. 3, 2000.
Mizutani, et al., "Design of a new bottom antireflective coating composition for KrF resist", p. 277 SPIE 25 th Annual Symposium on Microlithography, Feb. 27-Mar. 3, 2000.
Trefonas, "Organic Antireflective Coatings for 193nm Lithography", p. 298, SPIE 25th Annual Symposium on Microlithogrpahy, Feb. 27-Mar. 3, 2000.
Meador, "Recent Progress in 193nm Antireflective Coatings", p. 311, SPIE 25th Annual Symposium on Microlithogrpahy, Feb. 27-Mar. 3, 2000.
Ding, et al., Process and Performance Optimization of Bottom Antireflective Coatings (Part II), p. 328, SPIE 25th Annual Symposium on Microlithogrpahy, Feb. 27-Mar. 3, 2000.
Schiavone, et al., "SiON based antireflective coating for 193nm lithography", p. 335, SPIE 25th Annual Symposium on Microlithogrpahy, Feb. 27-Mar. 3, 2000.
Lu, "Performance impact of novel polymetric dyes in photresist application", p. 346, SPIE 25th Annual Symposium on Microlithogrpahy, Feb. 27-Mar. 3, 2000.
Stephen, et al., "Antireflective Coating for 193nm Lithography", p. 355, SPIE 25th Annual Symposium on Microlithogrpahy, Feb. 27-Mar. 3, 2000.
Chun, et al., "Novel Hardening Methods of DUV Chemically Amplified Photresist by Ion Implantation and its Application to New Organic ARC Material and Bilayer Process", p. 360. SPIE 25th Annual Symposium on Microlithogrpahy, Feb. 27-Mar. 3, 2000.
van Wingerden, "Joint optimisation of subtrate reflectivity, resist thickness and resist absorption for CD control and resolution", p. 451, SPIE 25th Annual Symposium on Microlithogrpahy, Feb. 27-Mar. 3, 2000.
Chou, et al., "Anti-Reflection Strategies for Sub-0.18um Dual Damascene Patterning in KrF 248nm Lithography", p. 453, SPIE 25th Annual Symposium on Microlithogrpahy, Feb. 27-Mar. 3, 2000.
Nakooka, et al., "Comparison of CD variation between organic and inorganic bottom anti-reflective coating on Topgraphic Substrates", p. 454, SPIE 25th Annual Symposium on Microlithogrpahy, Feb. 27-Mar. 3, 2000.
Bauer, et al, "ARC technology to minimize CD-Variations during Emitter structuring—Experiment and Simulation", p. 459, SPIE 25th Annual Symposium on Microlithogrpahy, Feb. 27-Mar. 3, 2000.
Allied Signal ACCUGLASS T-04 Spin-On Glass Material Safety Data Sheet, Jun. 30, 1998.
Honeywell Material Safety Data Sheet, ACCUGLASS T-08 (108, 208) Spin-On Glass, Jun. 19, 2002. pp. 1-8.
Honeywell ACCUSPIN 720 Spin-On Glass Material Safety Data Sheet, Mar. 7, 2000.
Allied Signal ACCUSPIN 720 Spin-On Polymer Product Bulletin, Sep. 1995.
Pacansky, et al., Photochemical Decompistion Mechanisms for AZ-Type Ogitresusts:m Hab, 1979m ogs 42-55.
Korchkov, et al., "Low Temperature Dielectric Films from Octavinylsilsequioxane", Dec. 1982, pp. 373-376.
Lavrent'yev, et al., "Polyhedral Oligosilsesquioxanes and their Homo Derivatives", Aug. 1981, pp. 199-236.
Lavrent'yev, et al., "Ethylmethyloctasesquioxanes: Products of the Reactions of Ethylpolycyclosiloxanes with Tricholomnethylsaine. Their Chromatographic Mass Spectrometic Investigation", 1981.
Li, et al., "Organosiloxane Based Bottom Antireflective Coatings for 193nm Lithography", pp. 1-10.
Li, et al., "An Organosiloxane Spin on Bottom Antireflective Coatings for ArF Lithography", pp. 1-9.
Lin et al, "Linewidth Control Using Anti-Reflective Coating for Optical Lithography", pp. 399-402.
Tanaka et al. "A New Photolithography Technique with Antireflective Coating on Resist: ARCOR", pp. 3900-3904.
Berg et al. "Antireflection coatings on metal layers for photolithographic purposes", p. 1212.
Resiser "Photoreactive Polymers—Multilayer Techniques and Plasma Processing", pp. 359-367.
Sheates "Photobleaching Chemistry of Polymers Containing Anthracese", pp. 332-348.

* cited by examiner

FIG. 1
PRIOR ART
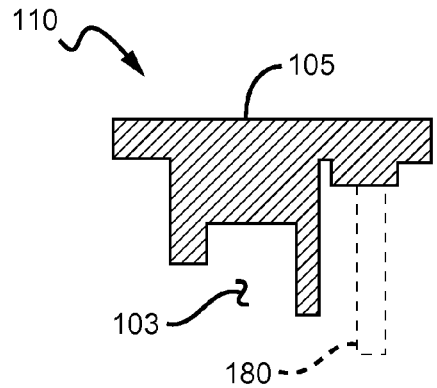
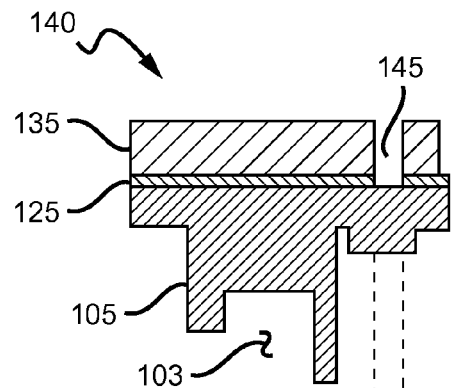
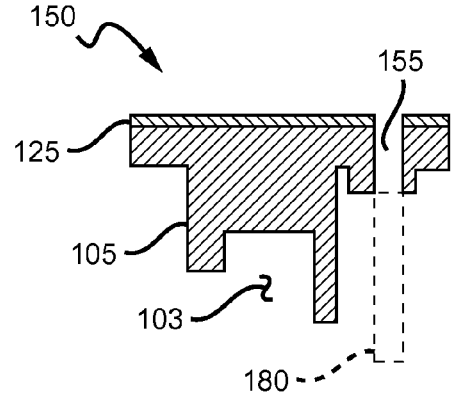
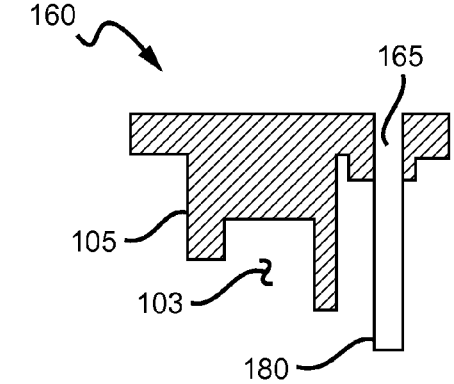
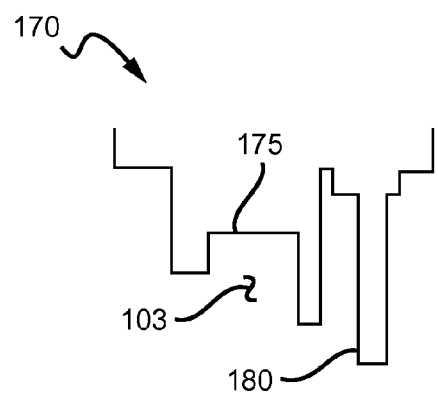

*FIG. 2*

210 — In order of addition, Ethanol, PGMEA TEOS, VTEOS, PTEOS, Water/0.1N Nitric Acid, and Butanol are added individually into a glass reaction vessel (Water/0.1N Nitric Acid are added together).

220 — Following the polymerization of the PTEOS, VTEOS, and TEOS, the polymer (in solution) is pumped into a second vessel for dilution with PGMEA, TMAN, and 5N-Nitric Acid. Each is added individually in the respective order.

230 — While the neat polymer is a solid, it is made, used and/or sold in a liquid solution and there is no exposure to the solid polymer. The amount of polymer in solution is typically 1.4-5.1% by weight.

240 — The final solution is pumped through a filtration unit (optional) and either used on-site as an intermediate in the production of another polymer or stored/packaged for commercial sale.

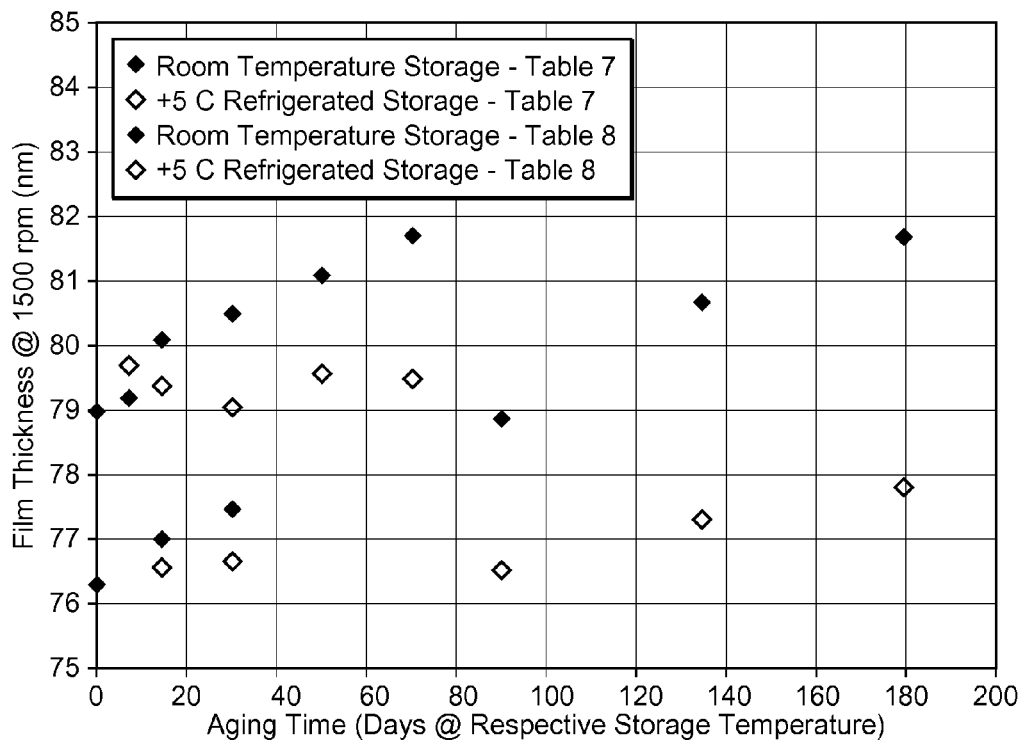

*FIG. 7*

COMPOSITIONS, COATINGS AND FILMS FOR TRI-LAYER PATTERNING APPLICATIONS AND METHODS OF PREPARATION THEREOF

This application is a United States Utility application that claims priority to U.S. Provisional Application 60/903,466 filed on Feb. 26, 2007 and U.S. Provisional Application 60/949,392 filed on Jul. 12, 2007, which are both commonly-owned and incorporated herein in their entirety by reference.

FIELD OF THE SUBJECT MATTER

The subject matter relates generally to compositions, coatings and films for use in tri-layer patterning applications and methods of producing the materials.

BACKGROUND

To meet the requirements for faster performance, the characteristic dimensions of features of integrated circuit devices have continued to be decreased. Manufacturing of devices with smaller feature sizes introduces new challenges in many of the processes conventionally used in semiconductor fabrication. One of the most important of these fabrication processes is photolithography.

Effective photolithography impacts the manufacture of microscopic structures, not only in terms of directly imaging patterns on a substrate, but also in terms of producing masks typically used in such imaging. Typical lithographic processes involve formation of a patterned resist layer by patternwise exposing a radiation-sensitive resist to an imaging radiation. The image is subsequently developed by contacting the exposed resist layer with a material (typically an aqueous alkaline developer) to selectively remove portions of the resist layer to reveal the desired pattern. The pattern is subsequently transferred to an underlying material by etching the material in openings of the patterned resist layer. After the transfer is complete, the remaining resist layer is removed.

For some lithographic imaging processes, the resist used does not provide sufficient resistance to subsequent etching steps to enable effective transfer of the desired pattern to a layer underlying the resist. In many instances (e.g., where an ultrathin resist layer is desired, where the underlying material to be etched is thick, where a substantial etching depth is required, and/or where it is desired to use certain etchants for a given underlying material), a hardmask layer may be used as an intermediate layer between the resist layer and the underlying material to be patterned by transfer from the patterned resist. The hardmask layer receives the pattern from the patterned resist layer and should be able to withstand the etching processes needed to transfer the pattern to the underlying material.

Also, where the underlying material layer is excessively reflective of the imaging radiation used to pattern the resist layer, a thin antireflective coating is typically applied between the underlying layer and the resist layer. In some instances, the antireflection/absorbing and hardmask functions may be served by the same material. In some instances, however, the chemistry of the antireflective layer and hardmask layer may need to be sufficiently different such that integrating this layer between a bottom organic layer and an upper photoresist may be difficult.

In addition, device fabrication has migrated to 90 nm node and smaller for next generation chips. The resist thickness has to be thinner than 300 nm due to image collapsing problems, low focus latitude from high NA tool, and high OD of resist formulation in 193 and 157 nm lithography Conventional thin resist films are not sufficient for etching processes. It may be desirable to have hardmask compositions which can be easily etched selective to the overlying photoresist while being resistant to the etch process needed to pattern the underlying layer. In a conventional multi-layer resist method, the bottom layer film consisting of the thick organic material film formed by coating on the film which is processed to form the flat surface, and a mask pattern consisting of a thin inorganic material film is formed on this flat surface by the ordinary photopatterning technology, as what is shown in Prior Art FIG. 1, for example. The exposed portions of the bottom layer film are removed by anisotropic etching such as, for instance, reactive sputter-etching, and the film to be processed of these portions exposed by etching is etched, thereby forming the patterns.

To form the patterns with good accuracy, it is necessary to form the mask pattern consisting of the intermediate film with high degree of accuracy. For this purpose, in the above-mentioned photopatterning step, it is important to absorb the light reflected from the surface of the film which is processed at the different-level portions and the like in the bottom layer film and intermediate film and thereby to prevent the reflected light from reaching the top layer film (the photoresist film).

However, since the intermediate film is used as the mask for etching the thick bottom layer film as described above, it is required that the intermediate film has enough resistance against the anisotropic etching such as the reactive sputter-etching or the like. In the conventional intermediate film, only the dry etching resisting property is seriously considered, but the consideration was not made with respect to the light absorption.

On the other hand, in the conventional multilayer resist method, only the reduction of the light reflected from the surface of the film which is processed by increasing the light absorption by the bottom layer film is seriously considered, and it was thought that the larger light extinction coefficient of the bottom layer film is more preferably.

However, an excessive large light extinction coefficient of the bottom layer film causes the amount of light reflected from the surface of the bottom layer film to be increased, so that the sum of the reflection light from the surface of the layer to be processed which passes through the bottom layer film and the light reflected by the surface of the bottom layer film contrarily increases. Thus, it has been found that the accuracy of dimensions of the resulting patterns is reduced. In addition, it has been found that not only the reflection light from the surface of the bottom layer film but also the reflection light from the surface of the intermediate film becomes a cause of reduction of the accuracy of dimensions of the patterns.

In another general trilayer approach, the underlayer is first applied to the surface of the substrate using a conventional deposition process such as chemical vapor deposition, spin-on coating, evaporation, plasma-assisted chemical vapor deposition, or physical vapor deposition. The thickness of the underlayer is typically about 80 to about 8000 nm. Next, an antireflective coating (BARC)/hardmask is applied to the upper surface of the underlayer utilizing a conventional deposition process such as spin-on coating, evaporation, chemical vapor deposition, plasma-assisted chemical vapor deposition, physical vapor deposition and other like deposition processes. This thickness of the anti-reflective coating/hardmask is typically from about 10 to about 500 nm, with a thickness from about 20 to about 200 nm being more typical.

In order to pattern the trilayer structure, a conventional photoresist is applied to the upper surface of the anti-reflective coating/hardmask and then the photoresist is subjected to conventional lithography which includes the steps of exposing the photoresist to a pattern of radiation, and developing the pattern into the exposed photoresist utilizing a conventional resist developer. Following the lithography step, the pattern is transferred into the trilayer structure by transferring the pattern from the resist to the anti-reflective coating/hardmask, and continuing the pattern transfer from the anti-reflective coating/hardmask to the underlayer and then to the substrate.

The first pattern transfer step typically includes the use of a dry etching process such as reactive-ion etching, ion beam etching, plasma etching or laser ablation. Reactive-ion etching is a preferred etching technique for transferring the pattern from the patterned photoresist to the anti-reflective coating/hardmask.

As stated above, after the first pattern transfer step, the pattern is transferred from the remaining resist and anti-reflective coating/hardmask to the underlayer and then the substrate utilizing one or more etching steps such as reactive ion etching, ion beam etching, plasma etching or laser ablation. The substrate may also be electroplated, metal deposited or ion implanted to form patterned structure. Preferably, the underlayer is etched by using oxygen as an etchant gas or plasma. During or after pattern transfer into the substrate, the anti-reflective coating/hardmask and underlayer are removed utilizing one or more patterning/etching processes that are capable of removing those layers. The result of this process is a patterned substrate.

Based on the different chemistries of the materials utilized in layered applications, along with the goals of the device/circuit and the patterning/etching process, it is clear that it may be more difficult than originally thought to produce and integrate an intermediate material that is compatible with both a bottom organic planarizing layer and an upper photoresist layer. Therefore, an absorbing/anti-reflective coating and lithography material needs to be developed that a) absorbs uniformly in the ultraviolet spectral region, b) contributes to improved photoresist patterning by expanding the focus matrix and the exposure latitude; c) provides improved adhesion between the anti-reflective coating layer and the organic planarizing layer in a tri-layer application and/or tri-layer patterning process; d) has a high etch selectivity; e) forms solutions that are stable and have a good shelf life; f) can be applied to a surface by any suitable application method, such as spin-on coating or chemical vapor deposition (CVD); and g) can be utilized in a number of applications, components and materials, including logic applications and flash applications. Contemplated anti-reflective coating/hardmask combinations, additives, coatings and/or materials are designed to replace and/or eliminate the middle inorganic layer that rests between the anti-reflective coating and the organic planarizing layer.

SUMMARY OF THE INVENTION

Compositions for use in tri-layer applications are described herein, wherein the composition has a matrix and includes: a formulated polymer comprising at least one type of silicon-based moiety forming the matrix of the polymer, a plurality of vinyl groups coupled to the matrix of the polymer, and a plurality of phenyl groups coupled to the matrix of the polymer, at least one condensation catalyst, and at least one solvent.

Tri-layer structures are also contemplated herein that comprise an organic underlayer (first layer), antireflective compositions and/or films contemplated herein (second layer) and a photoresist material (third layer) that are coupled to one another.

Methods of producing a composition for tri-layer patterning applications includes: providing a formulated polymer comprising at least one type of silicon-based moiety forming the matrix of the polymer, a plurality of vinyl groups coupled to the matrix of the polymer, and a plurality of phenyl groups coupled to the matrix of the polymer, providing at least one condensation catalyst, providing at least one solvent, providing at least one pH modifier, blending the formulated polymer and part of the at least one solvent in a reaction vessel to form a reactive mixture; and incorporating the at least one pH modifier, the at least one condensation catalyst and the remaining at least one solvent into the reactive mixture to form the composition.

BRIEF DESCRIPTION OF THE FIGURES

Prior Art FIG. 1 shows a contemplated trench formation utilizing tri-layer photolithography and patterning.

FIG. 2 shows a contemplated method for producing contemplated compositions.

FIG. 7 shows aging time versus film thickness for contemplated films.

DETAILED DESCRIPTION

Figure 3:
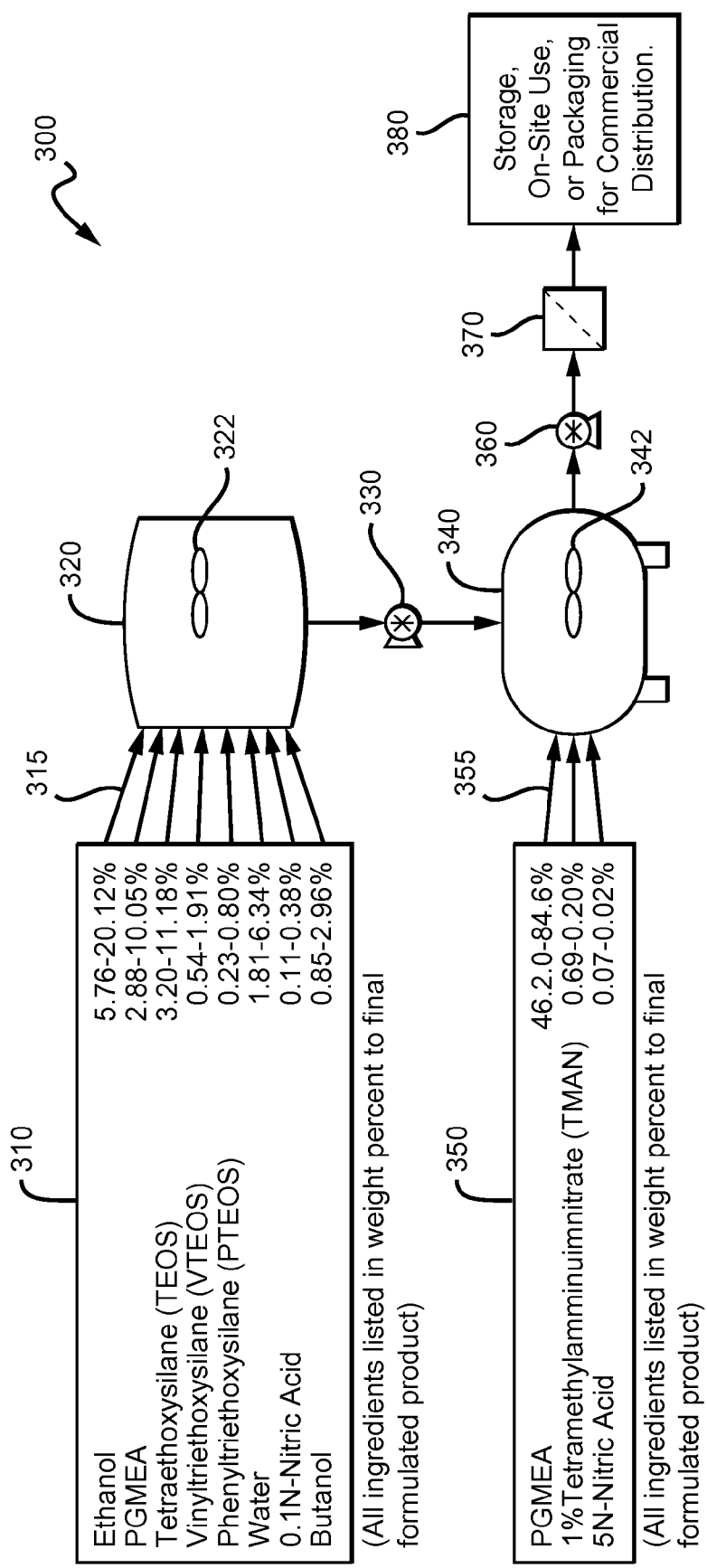
FIG. 3 shows a contemplated reaction vessel arrangement.

Tri-level photoresist patterning and related applications are important in order to achieve high numerical aperture patterning. In order to increase feature resolution, you must either lower the wavelength (by moving to 193 nm lithography) and/or increase the numerical aperture. In addition, a dual-level bottom antireflective coating or BARC reduces the substrate reflectivity or the light reflected back into the photoresist. Utilizing a tri-level or tri-layer patterning scheme also facilitates a dual patterning scheme (DPS), which splits the patterning of aggressive features into two distinct patterning steps. This DPS is an alternative to moving to a higher numerical aperture or next generation wavelength systems. These tri-layer patterning processes also facilitate the use of thinner ArF photoresist—plasma etch load now placed on the middle or intermediate layer and organic underlayer. ArF photoresist can now be designed for patterning performance and not competing plasma etch resiliance.

Prior Art FIG. 1 shows a contemplated trench formation utilizing tri-layer photolithography and patterning. In this scheme, an organic planarizing layer 105 (that is also UV absorbing) is spin-coated onto a fairly rough surface or substrate 103 in step 110. The trench feature 180 that is to be produced in the subsequent steps is drawn in for reference purposes. In step 120, a thin silicon-based layer 125 is spin-coated onto the organic layer 105. This silicon-based layer 125 is designed to aid in pattern transfer and has some absorption properties. In step 130, a photoresist 135 is applied to the layered material. The photoresist is then patterned and developed 137. A pattern 145 is then etched into the silicon-based layer in step 140. In step 150, the pattern 155 is transferred into the organic underlayer by an etching step, oxidizing or reducing chemistry, which may include an $O_2/N_2$ etch or $N_2/H_2$ chemistry. The pattern 165 is etched into the substrate in step 160, and the silicon-based layer is removed. Finally, in step 170, the organic fill material is cleaned from the substrate 103 surface 175 fully exposing the surface and the new trench feature. The thin silicon-based layer, which is added in step 120, is the component that may be the most difficult to produce and incorporate into the layering and trench-building process, since as already discussed, it must be compatible with both the organic planarizing layer and the photoresist, while at the same time having a desirable etch selectivity.

Based on the goals discussed earlier and the description of the conventional multi-layer or tri-layer patterning applications, compositions, absorbing/anti-reflective coatings and lithography materials have now been developed for these applications that a) absorb uniformly in the ultraviolet spectral region, b) contribute to improved photoresist patterning by expanding the focus matrix and the exposure latitude; c) provide improved adhesion between the anti-reflective coating layer and the organic planarizing layer in a tri-layer application and/or tri-layer patterning process; d) have a high etch selectivity; e) form solutions that are stable and have a good shelf life; f) can be applied to a surface by any suitable application method, such as spin-on coating or chemical vapor deposition (CVD); and g) can be utilized in a number of applications, components and materials, including logic applications and flash applications. These additives, coatings and/or materials are designed to replace and/or eliminate the middle inorganic layer that rests between the anti-reflective coating and the organic planarizing layer.

Compositions for use in tri-layer applications are described herein, wherein the composition has a matrix and includes: a formulated polymer comprising at least one type of silicon-based moiety forming the matrix of the polymer, a plurality of vinyl groups coupled to the matrix of the polymer, and a plurality of phenyl groups coupled to the matrix of the polymer, at least one condensation catalyst, and at least one solvent.

Tri-layer structures are also contemplated herein that comprise an organic underlayer (first layer), compositions, anti-reflective compositions and/or films contemplated herein (second layer) and a photoresist material (third layer) that are coupled to one another.

As used herein, the term "coupled" means that a plurality of monomers, moieties or constituents, a surface and layer or two layers are physically or chemically attached to one another or there's a physical attraction between two parts of matter or components, including bond forces such as covalent and ionic bonding, and non-bond forces such as Van der Waals, electrostatic, coulombic, hydrogen bonding and/or magnetic attraction. As used herein, "coupled" also refers to moieties or substituents that are physically drawn to, attached to, trapped in or chemically bonded to the matrix. Also, as used herein, the term coupled is meant to encompass a situation where two layers or materials are directly attached to one another, but the term is also meant to encompass the situation where the two layers or materials are coupled to one another indirectly—such as the case where there's an adhesion promoter layer between two other layers.

Methods of producing a composition for tri-layer patterning applications includes: providing a formulated polymer comprising at least one type of silicon-based moiety forming the matrix of the polymer, a plurality of vinyl groups coupled to the matrix of the polymer, and a plurality of phenyl groups coupled to the matrix of the polymer, providing at least one condensation catalyst, providing at least one solvent, providing at least one pH modifier, blending the formulated polymer and part of the at least one solvent in a reaction vessel to form a reactive mixture; and incorporating the at least one pH modifier, the at least one condensation catalyst and the remaining at least one solvent into the reactive mixture to form the composition.

"High Ratio" Inorganic Materials

High ratio inorganic materials and/or compounds are contemplated as a component in the compositions and coatings contemplated herein and, other than the at least one solvent, are present in the compositions and materials in the highest concentration of any component. In contemplated embodiments, these inorganic compounds and/or materials have a high molar ratio ("high ratio") of inorganic atom-oxygen linkages to other components or atoms, which in turn increases the "inorganic character" of the compound, as compared to compounds that may contain more carbon atoms. These inorganic materials are generally non-absorbing or weakly absorbing at some wavelengths and are designed to provide inorganic character to the composition without affecting the absorbing or adhesion characteristics of the composition or resulting coatings or films. In some embodiments, high ratio inorganic materials and/or compounds comprises silicon, which helps to increase the inorganic character of the ultimate composition through the incorporation of more silicon into the composition.

Specific examples of high ratio inorganic compounds and/or materials include silicon-based moieties, such as polymers, compounds, moities, substituents and/or monomers, which lead to more Si—O linkages in the composition or material. Contemplated silicon-based compounds and/or monomers include alkoxysilane compounds, such as tetramethoxysilane, tetraethoxysilane, tetrabutoxysilane, siloxane compounds, such as methylsiloxane, methylsilsesquioxane, some silazane polymers, dimethylsiloxane, silicate polymers, silsilic acid derivaties, acetoxy-based monomers and mixtures thereof. A contemplated silazane polymer is perhydrosilazane, which has a "transparent" polymer backbone.

Absorbing Materials

Contemplated compositions, materials, coatings and films also comprise at least one absorbing compound. Unlike the high ratio inorganic compounds discussed earlier, and other constituents disclosed herein, these contemplated absorbing compounds comprise a moiety within the compound that allows it to absorb light at particular wavelengths, and in some cases very strongly absorb light at particular wavelengths. Many naphthalene-, phenanthrene- and anthracene-based compounds have significant absorption at 248 nm and below. Benzene-based, equivalently termed here phenyl-based, compounds have significant absorption at wavelengths shorter than 200 nm. While these naphthalene-, anthracene-, phenanthrene- and phenyl-based compounds are frequently referred to as dyes, the term absorbing compound is used here because the absorptions of these compounds are not limited to wavelengths in the visible region of the spectrum.

However, not all such absorbing compounds can be incorporated into inorganic-based materials for use as anti-reflective coating materials. Contemplated absorbing compounds suitable for use have a definable absorption peak centered around wavelengths such as 248 nm, 193 nm, 157 nm or other ultraviolet wavelengths, such as 365 nm, that may be used in photolithography. It is contemplated that a suitable "definable absorption peak" is one that is at least 0.5 nm in width, wherein width is calculated by those methods commonly known in the art of photolithography. In other embodiments, the definable absorption peak is at least 1 nm in width. In yet other embodiments, the definable absorption peak is at least 5 nm in width. In some contemplated embodiments, the definable absorption peak is at least 10 nm in width.

The chromophores of suitable absorbing compounds typically have at least one benzene ring, and where there are two or more benzene rings, the rings may or may not be fused. Other chromaphores have "aromatic-type" linkages, such as vinyl groups at the ends or within the compounds that convert the compound to an absorbing compound. Incorporatable absorbing compounds have an accessible reactive group attached to the chromophore, wherein the reactive groups include hydroxyl groups, amine groups, carboxylic acid groups, and substituted silyl groups with silicon bonded to one, two, or three "leaving groups," such as alkoxy groups, acetoxy groups or halogen atoms. Ethoxy or methoxy groups or chlorine atoms are frequently used as leaving groups. Contemplated reactive groups comprise siliconalkoxy, silicondialkoxy and silicontrialkoxy groups, such as siliconethoxy, silicondiethoxy, silicontriethoxy, siliconmethoxy, silicondimethoxy, and silicontrimethoxy groups and halosilyl groups, such as chlorosilyl, dichlorosilyl, and trichlorosilyl groups, and acetoxy groups like methyltriacetoxysilane, tetraacetoxysilane.

The reactive groups may be directly bonded to the chromophore, as, for example, in phenyltriethoxysilane, or the reactive groups may be attached to the chromophore through an ester, a ketone and/or oxygen linkage or a hydrocarbon bridge, as, for example, in 9-anthracene carboxy-alkyl trialkoxysilane. The inclusion of silicontrialkoxy groups on chromophores has been found to be advantageous, especially for promoting stability of the absorbing spin-on glass or "SOG" films. Other useful absorbing compounds are those compounds that contain an azo group, —N=N—, and an accessible reactive group, particularly those containing an azo group linking benzene rings, especially when absorption around 365 nm is desired for the particular application. Azo groups may be included as part of a straight-chain molecule, a cyclic molecule or a hybrid straight-chain/cyclic molecule.

The absorbing compounds may be incorporated interstitially in the inorganic-based material matrix. The absorbing compounds may also be chemically bonded to the inorganic-based material or polymer through crosslinking reactions. In some contemplated embodiments, the incorporatable absorbing compounds form bonds with the inorganic-based material backbone or polymer backbone via the accessible reactive groups.

Examples of absorbing compounds suitable for use include those absorbing compounds that have a definable absorption peak around wavelengths less than about 375 nm, such as 365 nm, 248 nm, 193 nm and 157 nm, which include compounds such as anthraflavic acid (1), 9-anthracene carboxylic acid (2), 9-anthracene methanol (3), 9-anthracene ethanol (4), 9-anthracene propanol (5), 9-anthracene butanol (6), alizarin (7), quinizarin (8), primuline (9), 2-hydroxy-4-(3-triethoxysilylpropoxy)-diphenylketone (10), 2-hydroxy-4-(3-trimethoxysilylpropoxy)-diphenylketone (11), 2-hydroxy-4-(3-tributoxysilyipropoxy)-diphenylketone (12), 2-hydroxy-4-(3-tripropoxysilylpropoxy)-diphenylketone (13), rosolic acid (14), triethoxysilylpropyl-1,8-naphthalimide (15), trimethoxysilylpropyl-1,8-naphthalimide (16), tripropoxysilylpropyl-1,8-naphthalimide (17), 9-anthracene carboxy-methyl triethoxysilane (18), 9-anthracene carboxy-ethyl triethoxysilane (19), 9-anthracene carboxy-butyl triethoxysilane (20), 9-anthracene carboxy-propyl triethoxysilane (21), 9-anthracene carboxy-methyl trimethoxysilane (22), 9-anthracene carboxy-ethyl tributoxysilane (23), 9-anthracene carboxy-methyl tripropoxysilane (24), 9-anthracene carboxy-propyl trimethoxysilane (25), phenyltriethoxysilane (26), phenyltrimethoxysilane (27), phenyltripropoxysilane (28), 10-phenanthrene carboxy-methyl triethoxysilane (29), 10-phenanthrene carboxy-ethyl triethoxysilane (30), 10-phenanthrene carboxy-methyl trimethoxysilane (31), 10-phenanthrene carboxy-propyl triethoxysilane (32), 4-phenylazophenol, (33), 4-ethoxyphenylazobenzene-4-carboxy-methyl triethoxysilane (34), 4-methoxyphenylazobenzene-4-carboxy-ethyl triethoxysilane (35), 4-ethoxyphenylazobenzene-4-carboxy-propyl triethoxysilane (36), 4-butoxyphenylazobenzene-4-carboxy-propyl triethoxysilane (37), 4-methoxyphenylazobenzene-4-carboxy-methyl triethoxysilane (38), 4-ethoxyphenylazobenzene-4-carboxy-methyl triethoxysilane (39), 4-methoxyphenylazobenzene-4-carboxy-ethyl triethoxysilane (40), 4-methoxyphenylazobenzene-4-carboxy-propyl triethoxysilane (41), vinyltriethoxysilane (42) and combinations, thereof. It should be appreciated, however, that this list of specific compounds is not an exhaustive list, and that contemplated compounds can be selected from the broader chemical compound classes that comprise these specific compounds.

Absorbing compounds 1-25 and 29-41 are available commercially, for example, from Aldrich Chemical Company (Milwaukee, Wis.). 9-anthracene carboxy-alkyl trialkoxysilanes are synthesized using esterification methods, as described in detail in PCT Patent Application Serial No. PCT/US02/36327 filed on Nov. 12, 2002, which is commonly-owned and incorporated herein in its entirety by reference, including all related and commonly-owned foreign and domestic issued patents and patent applications. Absorbing compound 26-28 is available commercially from Gelest, Inc. (Tullytown, Pa.). Examples of phenyl-based absorbing compounds in addition to absorbing compound (26-28), many of which are also commercially available from Gelest, Inc., include structures with silicon-based reactive groups attached to phenyl rings or to substituted phenyls, such as methylphenyl, chlorophenyl, and chloromethylphenyl. Specific phenyl-based absorbing compounds include phenyltrimethoxysilane, benzyltrichlorosilane, chloromethylphenyltrimethoxysilane, phenyltrifluorosilane, to name only a few examples. Diphenyl silanes including one or two "leaving groups," such as diphenylmethylethoxysilane, diphenyldiethoxysilane, and diphenyldichlorosilane, to again name only a few examples, are also suitable incorporatable absorbing compounds Alkoxybenzoic acids may also be used as absorbing compounds, including methoxybenzoic acid Adhesion Promoters In some contemplated embodiments, the at least one adhesion promoter comprises at least one of the following characteristics: a) is thermally stable after heat treatment, such as baking, at temperatures generally used for electronic and semiconductor component manufacture; b) has a relatively low catalytic ability, in that the donor does not initiate significant crosslinking activity in the composition to which it is added; c) is relatively neutral, so that the composition retains a low pH; d) is acidic, in order to lower the pH of the composition; e) does not initiate or propagate reactions that increase the molecular weight of species in the composition to which it is added; f) can surprisingly act as an adhesion promoter by promoting electrostatic and coulombic interactions between layers of materials, as opposed to conventionally understood Van der Waals interactions.

Adhesion to an organic resist polymer designed for low absorptivity in the UV is inherently difficult because such resists are designed with low polarity and few functional groups with which to interact adhesively. The adhesion mechanisms of silica-based formulations specifically to these organic resist polymers follows one of two pathways: a) adhesion promotion due to reduction in silanol content and increase in Van der Waals interactions and b) adhesion promotion due to an increase in the ionic contributions such as electrostatic and coulombic interaction.

In some embodiments, adhesion promoters may comprise polydimethylsiloxane materials, ethoxy or hydroxy-containing silane monomers, vinyl-containing silane monomers, such as vinyltriethoxysilane (VTEOS), acrylated silane monomers, or silyl hydrides. VTEOS, for example, has been shown to impart enhanced adhesion improvement in coatings and compositions, such as those described in the Examples section. VTEOS can act both as an adhesion promoter and as an absorbing compound. Surprisingly, as is shown in the Examples section, the addition of VTEOS also improved the exposure latitude and depth of focus in the films. In other words, the presence of VTEOS greatly improved photoresist adhesion and patterning process margin.

In a contemplated embodiment, the addition of at least one adhesion promoter, such as at least one weak acid/weak base, at least one weak acid/strong base, at least one strong acid/strong base, at least one strong acid/weak base, at least one amine base, at least one amine salt or a combination thereof increases the electrostatic and coulombic interaction. Both modeled and experimental results indicate that the salt and not the neutral (non-ionic) form of the amine enhance adhesion sufficiently with the resist to avoid collapse of lithographically defined resist lines. This adhesion enhancement is demonstrated in the successful use of higher pH amine formulations (for example pH 5.5 formulations) where and APTEOS nitrate salt has been formed. This mechanism can also be found when using other amine salts such as: APTEOS acetate, APTEOS sulfonate, APTEOS methanesulfonate, APTEOS triflate, APTEOS tosylate, APTEOS nonafluorobutane-1-sulfonate (nfbs), tetramethylammonium hydroxide, tetramethylammonium acetate, tetramethylammonium nitrate, tetramethylammonium sulfate, tetramethylammonium methanesulfonate, tetramethylammonium triflate, tetramethylammonium tosylate, tetramethylammonium nfbs, tetramethylammonium triflate, ammonium nitrate, ammonium acetate, ammonium triflate, ammonium tosylate, ammonium sulfonate, ammonium methanesulfonate, or any other amine salt or combination of amine salts. Suitable amine bases comprise ammonium, pyridine, aniline, TMAH, CTAH, TBAH, APTEOS or a combination thereof. The modeled adhesion energies indicates that the higher ionic salts (higher charged centers) increase the adhesion better than those in which the charge may be more distributed, such as in ammonium centers with large R groups. (see Table 1 below) Mechanisms and apparatus used for the modeling experiments are those found in U.S. Pat. No. 6,544,650 issued to Nancy Iwamoto, and U.S. application Ser. Nos. 09/543,628; 10/113,461; 10/326,233 and related PCT Applications, such as PCT/US03/07607, and foreign applications, all of which are commonly owned by Honeywell International Inc. and which are incorporated herein in their entirety.

TABLE 1

|  | Adhesion J/m2 Lo j/m2 |
|---|---|
| Adhesion of hi silanol content DUV193 to Norbornene-based Resist | 3.74 |
| Adhesion of lo silanol content DUV193 to Norbornene-based Resist | 5.66 |

TABLE 1-continued

| Additives to hi silanol content DUV 193 | Adhesion J/m2 |
|---|---|
| trivinylsilane | 4.05 |
| cetyltrimethylammonium hydroxide | 2.57 |
| tmah added (tmah nitrate) | 5.18 |
| py nitrate | 5.72 |
| trimethylsulfonium methylsulfate | 4.70 |
| tetramethylammonium methanesulfonate | 5.50 |
| tetramethylammonium benzenesulfonate | 5.20 |
| tetramethylammonium toluenesulfonate | 3.9 |
| tetramethylammonium triflate (trifluoromethanesulfonate) | 4.5 |
| apteos triflate (trifluoromethanesulfonate) | 5.2 |
| apteos methanesulfonate | 5.2 |
| NH4 triflate | 6 |
| NH4 nitrate | 6 |
| NH4 toluenesulfonate | 4.8 |
| NH4 methanesulfonate | 5.3 |
| apteos nitrate | 4.9 |
| apteos toluene sulfonate | 2.9 |
| NH4OH | 3.8 |
| apteos triflate (trifluoromethanesulfonate) 5 molecules water | 3.82 |
| NH4 triflate (5 molecules water) | 3.88 |
| NH4 triflate (2 molecules water) | 5.85 |
| apteos nitrate added but not bonded | 3.85 |
| apteos no salt, bonded (compare to apteos nitrate salt at 4.9) | 3.08 |
| ammonium trfilate + ammonium triflate | 8.3 |
| apteos triflate + ammonium triflate | 6.1 |
| apteos triflate + apteos triflate | 5.1 |

The phrase "adhesion promoter" as used herein means any component or combination of components that when used with a target composition, improves the adhesion of the target composition to substrates and/or surfaces as compared to using the target composition alone. The target composition may comprise any composition that can be or is applied to a substrate, surface, layered surface, electronic or semiconductor component, including a formulated polymer, an antireflective composition, a coating material and/or a thermally degradable polymer. The adhesion promoter may be a co-monomer reacted with a thermally degradable polymer precursor or an additive to a thermally degradable polymer precursor. Examples of several useful adhesion promoters are disclosed in commonly assigned pending U.S. application Ser. No. 10/158,513 filed May 30, 2002 incorporated herein in its entirety.

In some embodiments, enhancement of the adhesion is concentration controlled, so that any procedure that helps to concentrate the adhesion promoter, such as an amine salt, at the interface of the adjacent layer, such as a silica-resist, will help adhesion. A simple solution is increasing the amount of salt species introduced into the formulation. Such other procedures include: solvation control of the salt by control of solvent; evaporation control of the solvent during spin coat or bake; addition of solubility control agents which control solubility of the salt, and addition of ammonium species to the resist.

Modeling indicates that a salt mixture can be used with the same effectiveness as a single component. These mixed salt adhesion promotion schemes can be used when an increase in organic amine is required for solvent compatibility. In this case, a larger R group on the substituted ammonium center may be used, but the loss in adhesion can be compensated by addition of a more charged center such as ammonium.

As mentioned, a contemplated adhesion promoter may comprise nitrogen, phosphorus or any other similarly characterized atom. Contemplated adhesion promoters may comprise a neutral or acidic compound or molecule, such as amines salts, methylammonium nitrate, tetramethylammonium acetate (TMAA), tetrabutylammonium acetate (TBAA), cetyltrimethylammonium acetate (CTAA), and tetramethylammonium nitrate (TMAN). TMAN can be obtained by either dissolving TMAN in water or by converting TMAA or TMAH to TMAN by using nitric acid. Contemplated salts comprise those salts from strong acids and primary, secondary, tertiary or tetraamines.

Another suitable adhesion promoter contemplated herein is to utilize an amine salt, such as those already disclosed herein, synthesized using at least one acid with a long tail or bulky group, such as nonafluorobutane-1-sulfonic acid (nfbs) or dodecylbenzenesulfonic acid (dbs) or to utilize an acid bonded to a silane having a reactive functional group, such as acid-TEOS.

In addition, adhesion enhancement is demonstrated in the successful use of higher pH amine formulations (for example pH 5.5 formulations) where and APTEOS nitrate salt has been formed. This mechanism can also be found when using other amine salts such as: APTEOS acetate, APTEOS sulfonate, APTEOS methanesulfonate, APTEOS triflate, APTEOS tosylate, APTEOS nonafluorobutane-1-sulfonate (nfbs), tetramethylammonium hydroxide, tetramethylammonium acetate, tetramethylammonium nitrate, tetramethylammonium sulfate, tetramethylammonium methanesulfonate, tetramethylammonium triflate, tetramethylammonium tosylate, tetramethylammonium nfbs, tetramethylammonium triflate, ammonium nitrate, ammonium acetate, ammonium triflate, ammonium tosylate, ammonium sulfonate, ammonium methanesulfonate, or any other amine salt or combination of amine salts. Suitable amine bases comprise ammonium, pyridine, aniline, TMAH, CTAH, TBAH, APTEOS or a combination thereof.

In some embodiments, the ratio of "mole of nitrogen/Si-compound weight (ppm)" in nitrogen containing absorbing compositions and/or coating materials is greater than about 0.01. In other embodiments, the ratio of "mole of nitrogen/Si-compound weight (ppm)" in nitrogen containing absorbing compositions and/or coating materials is greater than about 3. In yet other embodiments, the ratio of "mole of nitrogen/Si-compound weight (ppm)" in nitrogen containing absorbing compositions and/or coating materials is greater than about 4. The optimum ratio depends on an evaluation of several properties by the skilled artisan of the coating material/composition, such as the amount of organic moiety present in the material/composition, the degree of crosslinking present in the material/composition and the pH of the material/composition; however, it should be understood that the ratio influences the lithography properties and film densification properties more so than any other previously mentioned material/composition property with respect to nitrogen-containing compositions. It should also be understood that depending on the amount of organic moiety present, the degree of crosslinking present and/or the pH of the material/composition, a suitable mole/weight ratio can be recognized and used to produce the absorbing compositions and/or coating materials contemplated herein. As mentioned, it should be understood that the at least one adhesion promoter can also function as a crosslinking agent or a catalyst.

Adhesion promoters contemplated herein may also comprise compounds having at least bifunctionality wherein the bifunctionality may be the same or different and at least one of the first functionality and the second functionality is selected from the group consisting of Si-containing groups; N-containing groups; C bonded to O-containing groups; hydroxyl groups; and C double bonded to C-containing groups. The phrase "compound having at least bifunctionality" as used herein means any compound having at least two functional groups capable of interacting or reacting, or forming bonds as follows. The functional groups may react in numerous ways including addition reactions, nucleophilic and electrophilic substitutions or eliminations, radical reactions, etc. Further alternative reactions may also include the formation of non-covalent bonds, such as Van der Waals, electrostatic bonds, ionic bonds, and hydrogen bonds.

In some embodiments of the at least one adhesion promoter, preferably at least one of the first functionality and the second functionality is selected from Si-containing groups; N-containing groups; C bonded to O-containing groups; hydroxyl groups; and C double bonded to C-containing groups. Preferably, the Si-containing groups are selected from Si—H, Si—O, and Si—N; the N-containing groups are selected from such as C—$NH_2$ or other secondary and tertiary amines, imines, amides, and imides; the C bonded to O-containing groups are selected from =CO, carbonyl groups such as ketones and aldehydes, esters, —COOH, alkoxyls having 1 to 5 carbon atoms, ethers, glycidyl ethers; and epoxies; the hydroxyl group is phenol; and the C double bonded to C-containing groups are selected from allyl and vinyl groups. For semiconductor applications, the more preferred functional groups include the Si-containing groups; C bonded to O-containing groups; hydroxyl groups; and vinyl groups.

Contemplated adhesion promoters may also comprise an organic resin-based material that further comprises phenolic-containing resins, novolac resins, such as CRJ-406 or HRJ-11040 (both from Schenectady International, Inc.), organic acrylate and/or a styrene resins. Other adhesion promoters may comprise polydimethylsiloxane materials, ethoxy or hydroxy-containing silane monomers, vinyl-containing silane monomers, acrylated silane monomers, or silyl hydrides.

An example of a contemplated adhesion promoter having Si-containing groups is silanes of the Formula I: $(R_{14})_k(R_{15})_l Si(R_{16})_m(R_{17})_n$ wherein $R_{14}$, $Ru_{15}$, $R_{16}$, and $R_{17}$ each independently represents hydrogen, hydroxyl, unsaturated or saturated alkyl, substituted or unsubstituted alkyl where the substituent is amino or epoxy, saturated or unsaturated alkoxyl, unsaturated or saturated carboxylic acid radical, or aryl; at least two of $R_{14}$, $R_{15}$, $R_{16}$, and $R_{17}$ represent hydrogen, hydroxyl, saturated or unsaturated alkoxyl, unsaturated alkyl, or unsaturated carboxylic acid radical; and $k+l+m+n \leq 4$. Examples include vinylsilanes such as $H_2C$=$CHSi(CH_3)_2H$ and $H_2C$=$CHSi(R_{18})_3$ where $R_{18}$ is $CH_3O$, $C_2H_5O$, AcO, $H_2C$=CH, or $H_2C$=$C(CH_3)O$—, (R18=alkoxy, acetoxy groups), or vinylphenylmethylsilane; allylsilanes of the formula $H_2C$=$CHCH_2$—$Si(OC_2H_5)_3$ and $H_2C$=$CHCH_2$—$Si(H)(OCH_3)_2$; glycidoxypropylsilanes such as (3-glycidoxypropyl)methyldiethoxysilane and (3-glycidoxypropyl)trimethoxysilane; methacryloxypropylsilanes of the formula $H_2C$=$(CH_3)COO(CH_2)_3$—$Si(OR_{19})_3$ where $R_{19}$ is an alkyl, preferably methyl or ethyl; aminopropylsilane derivatives including $H_2N(CH_2)_3Si(OCH_2CH_3)_3$, $H_2N(CH_2)_3Si(OH)_3$, or $H_2N(CH_2)_3OC(CH_3)_2CH$=$CHSi(OCH_3)_3$. The aforementioned silanes are commercially available from Gelest.

An example of a contemplated adhesion promoter having C bonded to O-containing groups is glycidyl ethers including but not limited to 1,1,1-tris-(hydroxyphenyl)ethane tri-glycidyl ether which is commercially available from TriQuest. An example of a preferred adhesion promoter having C bonded to O-containing groups is esters of unsaturated carboxylic acids containing at least one carboxylic acid group. Examples include trifunctional methacrylate ester, trifunctional acrylate ester, trimethylolpropane triacrylate, dipentaerythritol pentaacrylate, and glycidyl methacrylate. The foregoing adhesion promoters are commercially available from Sartomer.

One contemplated adhesion promoter having vinyl groups is vinyl cyclic pyridine oligomers or polymers wherein the cyclic group is pyridine, aromatic, or heteroaromatic. Useful examples include but not limited to 2-vinylpyridine and 4-vinylpyridine, commercially available from Reilly; vinyl aromatics; and vinyl heteroaromatics including but not limited to vinyl quinoline, vinyl carbazole, vinyl imidazole, and vinyl oxazole.

An example of a preferred adhesion promoter having Si-containing groups is the polycarbosilane disclosed in commonly assigned copending allowed U.S. patent application Ser. No. 09/471,299 filed Dec. 23, 1999 incorporated herein by reference in its entirety. The polycarbosilane is that shown in Formula II:

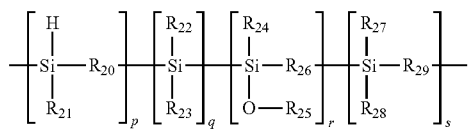

in which $R_{20}$, $R_{26}$, and $R_{29}$ each independently represents substituted or unsubstituted alkylene, cycloalkylene, vinylene, allylene, or arylene; $R_{21}$, $R_{22}$, $R_{23}$, $R_{24}$, $R_{27}$, and $R_{28}$ each independently represents hydrogen atom or organo group comprising alkyl, alkylene, vinyl, cycloalkyl, allyl, or aryl and may be linear or branched; $R_{25}$ represents organosilicon, silanyl, siloxyl, or organo group; and p, q, r, and s satisfy the conditions of $[4 \leq p+q+r+s \leq 100,000]$, and q and r and s may collectively or independently be zero. The organo groups may contain up to 18 carbon atoms but generally contain from about 1 to about 10 carbon atoms. Useful alkyl groups include —$CH_2$— and —$(CH_2)_t$— where t>1.

Contemplated polycarbosilanes include dihydridopolycarbosilanes in which $R_{20}$ is a substituted or unsubstituted alkylene or phenyl, $R_{21}$ group is a hydrogen atom and there are no appendent radicals in the polycarbosilane chain; that is, q, r, and s are all zero. Another preferred group of polycarbosilanes are those in which the $R_{21}$, $R_{22}$, $R_{23}$, $R_{24}$, $R_{25}$, and $R_{28}$ groups of Formula II are substituted or unsubstituted alkenyl groups having from 2 to 10 carbon atoms. The alkenyl group may be ethenyl, propenyl, allyl, butenyl or any other unsaturated organic backbone radical having up to 10 carbon atoms. The alkenyl group may be dienyl in nature and includes unsaturated alkenyl radicals appended or substituted on an otherwise alkyl or unsaturated organic polymer backbone. Examples of these preferred polycarbosilanes include dihydrido or alkenyl substituted polycarbosilanes such as polydihydridocarbosilane, polyallylhydrididocarbosilane and random copolymers of polydihydridocarbosilane and polyallylhydridocarbosilane.

In other contemplated polycarbosilanes, the $R_{21}$ group of Formula II is a hydrogen atom and $R_{21}$ is methylene and the appendent radicals q, r, and s are zero.

Other preferred polycarbosilane compounds of the invention are polycarbosilanes of Formula II in which $R_{21}$ and $R_{27}$ are hydrogen, $R_{20}$ and $R_{29}$ are methylene, and $R_{28}$ is an alkenyl, and appendent radicals q and r are zero. The polycarbosilanes may be prepared from well-known prior art processes or provided by manufacturers of polycarbosilane compositions. In the most preferred polycarbosilanes, the $R_{21}$ group of Formula II is a hydrogen atom; $R_{24}$ is —$CH_2$—; q, r, and s are zero and p is from 5 to 25. These polycarbosilanes may be obtained from Starfire Systems, Inc.

As can be observed in Formula II, the polycarbosilanes utilized may contain oxidized radicals in the form of siloxyl groups when r>0. Accordingly, $R_{25}$ represents organosilicon, silanyl, siloxyl, or organo group when r>0. It is to be appreciated that the oxidized versions of the polycarbosilanes (r>0) operate very effectively in, and are well within the purview of the present invention. As is equally apparent, r can be zero independently of p, q, and s the only conditions being that the radicals p, q, r, and s of the Formula II polycarbosilanes must satisfy the conditions of $[4 < p+q+r+s < 100,000]$, and q and r can collectively or independently be zero.

The polycarbosilane may be produced from starting materials that are presently commercially available from many manufacturers and by using conventional polymerization processes. As an example of synthesis of the polycarbosilanes, the starting materials may be produced from common organo silane compounds or from polysilane as a starting material by heating an admixture of polysilane with polyborosiloxane in an inert atmosphere to thereby produce the corresponding polymer or by heating an admixture of polysilane with a low molecular weight carbosilane in an inert atmosphere to thereby produce the corresponding polymer or by heating an admixture of polysilane with a low molecular carbosilane in an inert atmosphere and in the presence of a catalyst such as polyborodiphenylsiloxane to thereby produce the corresponding polymer. Polycarbosilanes may also be synthesized by the Grignard Reaction reported in U.S. Pat. No. 5,153,295 hereby incorporated by reference in its entirety.

An example of a preferred adhesion promoter having hydroxyl groups is phenol-formaldehyde resins or oligomers of the Formula III —$[R_{30}C_6H_2(OH)(R_{31})]_u$— where $R_{30}$ is substituted or unsubstituted alkylene, cycloalkylene, vinyl, allyl, or aryl; $R_{31}$ is alkyl, alkylene, vinylene, cycloalkylene, allylene, or aryl; and u=3-100. Examples of useful alkyl groups include —$CH_2$— and —$(CH_2)_v$— where v>1. A particularly useful phenol-formaldehyde resin oligomer has a molecular weight of 1500 and is commercially available from Schenectady International Inc.

Catalysts

As mentioned, some contemplated compositions comprises at least one condensation catalyst and at least one acid catalyst. As used herein, the term "catalyst" means any substance that affects the rate of the chemical reaction by lowering the activation energy for the chemical reaction. In some cases, the catalyst will lower the activation energy of a chemical reaction without itself being consumed or undergoing a chemical change.

Condensation catalysts act as crosslinking agents in these embodiments. As used herein, the term "crosslinking" refers to a process in which at least two molecules, or two portions of a long molecule, are joined together by a chemical interaction. Such interactions may occur in many different ways including formation of a covalent bond, formation of hydrogen bonds, hydrophobic, hydrophilic, ionic or electrostatic interaction. Furthermore, molecular interaction may also be characterized by an at least temporary physical connection between a molecule and itself or between two or more molecules.

Condensation catalysts are generally activated at a particular temperature, such as an elevated temperature. Thus, at one temperature (such as room temperature) contemplated compositions maintain a low molecular weight, thus enabling good planarization ability over the wafer and/or substrate topography. When the temperature is elevated (such as to greater than 50° C.), the condensation catalyst catalyzes the Si—OH condensation reaction, which results in a more dense structure and, in some cases, improved photolithographic performance overall.

Contemplated condensation catalysts also comprise those catalysts that can aid in maintaining a stable silicate solution. The metal-ion-free catalyst is selected from the group consisting of onium compounds and nucleophiles. The catalyst may be, for example an ammonium compound, an amine, a phosphonium compound or a phosphine compound. Non-exclusive examples of such include tetraorganoammonium compounds and tetraorganophosphonium compounds including tetramethylammonium acetate (TMAA), tetramethylammonium hydroxide (TMAH), tetrabutylammonium acetate (TBAA), cetyltrimethylammonium acetate (CTAA), tetramethylammonium nitrate (TMAN), triphenylamine, trioctylamine, tridodecylamine, triethanolamine, tetramethylphosphonium acetate, tetramethylphosphonium hydroxide, triphenylphosphine, trimethylphosphine, trioctylphosphine, and combinations thereof.

In some embodiments, TMAN is used and can be obtained by either dissolving TMAN in water or by converting TMAA or TMAH to TMAN by using nitric acid. The composition may further comprise a non-metallic, nucleophilic additive which accelerates the crosslinking of the composition. These include dimethyl sulfone, dimethyl formamide, hexamethylphosphorous triamide (HMPT), amines and combinations thereof. Examples of several useful crosslinking agents are disclosed in commonly owned and pending PCT Application Serial No.: PCT/US02/15256 (Publication No. WO 03/088344), which is also herein incorporated herein in its entity. TMAN, in some embodiments, is used to increase crosslinking density for improved robustness to nitrogen/oxygen RIE plasma and as an amine source for photoresist adhesion.

In other contemplated embodiments, at least one acid catalysts may also be added. Contemplated acid catalysts include $HNO_3$, HCl, lactic acid, acetic acid, oxalic acid, succinic acid, maleic acid and combinations thereof. The at least one acid catalyst is added to the composition in order to "tune" or adjust the pH of the final material so that it is compatible or more compatible with any chosen resist material, including those with absorption peaks around 365 nm, 248 nm, 193 nm and 157 nm, along with increasing the stability and shelf life of the composition. Contemplated acid catalysts may also be those also found in commonly assigned PCT Application Serial No.: PCT/US01/45306 filed on Nov. 15, 2001, which is incorporated by reference in its entirety. In some embodiments, nitric acid is incorporated into the composition in a reflux reaction, and in other embodiments, nitric acid is added a second time to adjust the pH after the addition of the condensation catalyst in order to improve shelf life of the composition.

Solvents

As mentioned, at least one solvent may be added to the composition. The solvent may be specifically chosen for a particular coating composition based on polarity and/or functional groups other than those characteristics needed by the solvent to blend with or solvate the components of the coating composition. Typical solvents are also those solvents that are able to solvate the non-inorganic materials and absorbing compounds contemplated herein, so that they may be used as coating compositions, materials and films. Contemplated solvents include any suitable pure or mixture of organic, organometallic or inorganic molecules that are volatilized at a desired temperature. The solvent may also comprise any suitable pure or mixture of polar and non-polar compounds. In some embodiments, the solvent comprises water, ethanol, propanol, acetone, toluene, ethers, cyclohexanone, butyrolactone, methylethylketone, methylisobutylketone, N-methylpyrrolidone, polyethyleneglycolmethylether, mesitylene, ethyl lactate, PGMEA, anisole, and families of poly-ether solvents such as carbitols (which constitute a family of ethyleneglycol ethers capped by hydroxy, alkoxy or carboxy groups) and analogous propyleneglycol ethers.

In some embodiments, water is added in addition to the at least one solvent in order to increase the crosslinking of the coating or film that is formed from the antireflective composition. So, in some embodiments, water may not be functioning solely as a solvent (or as a solvent at all), but may be functioning as a crosslinking agent. As will be shown in the examples, water is added in an amount that is up to about 10 weight percent of the total composition. In other embodiments, water is added up to about 8 weight percent of the total composition. In yet other embodiments, water is added up to about 5 weight percent of the total composition. And in even other embodiments, water is added up to about 3 weight percent of the total composition. In embodiments where water is added to the composition, crosslinking density increases and robustness is improved to nitrogen/oxygen RIE plasmas.

Solvents and solvent mixtures may be present in solution in an amount less than about 99.5% by weight. In some embodiments, the solvents or solvent mixtures may be present in solution in an amount from about 30% to about 99.5% by weight.

The solvents used herein may comprise any suitable impurity level, such as less than about 1 ppm, less than about 100 ppb, less than about 10 ppb, less than about 1 ppb, less than about 100 ppt, less than about 10 ppt and in some cases, less than about 1 ppt. These solvents may be purchased having impurity levels that are appropriate for use in these contemplated applications or may need to be further purified to remove additional impurities and to reach the less than about 10 ppb, less than about 1 ppb, less than about 100 ppt or lower levels that are becoming more desirable in the art of photolithography and etching.

Methods of Production

One contemplated method of making a composition and/or coating material contemplated herein comprises at least one high ratio inorganic compound, at least one absorbing compound, at least one condensation catalyst, at least one acid catalyst, an acid/water mixture, such as a nitric acid/water mixture, and at least one solvent to form a reaction mixture; and heating to a temperature about or above 40° C. or refluxing the reaction mixture to form the antireflective composition. The absorbing composition formed is then diluted with at least one solvent to provide coating solutions that produce films of various thicknesses.

Ethanol, PGMEA, TEOS, vinyltriethoxysilane (VTEOS) and PTEOS are added individually into a glass reaction vessel, along with a water/0.1N nitric acid mixture and butanol. PTEOS, VTEOS and TEOS polymerize in solution and the polymer/solution mixture is pumped into a second vessel for dilution with PGMEA, TMAN and 5N nitric acid, each of which is added individually. While the neat polymer is a solid, this polymer is made, used and/or sold in a liquid solution and there is no exposure to the solid polymer. The amount of polymer in solution is typically 1.4-5.1% by weight. The final solution is pumped through a filtration unit (which is optional) and either used on-site as intermediate in the production of another polymer or stored/packaged for commercial sale. FIGS. 2 and 3 show a contemplated method and reaction vessel arrangement. In FIG. 2, ethanol, PGMEA, TEOS, VTEOS, PTEOS, water/0.1N nitric acid and butanol are added individually into a glass reaction vessel with water and 0.1 N nitric acid added together, as part of step 210. In step 220, following the polymerization of PTEOS, VTEOS and TEOS, the polymer (in solution) is pumped into a second vessel for dilution with PGMEA, TMAN and 5N-nitric acid. Each one is added individually in their respective order. In step 230, while the neat polymer is solid, it is made, used and/or sold in a liquid solution and there is no exposure to the solid polymer The amount of polymer in solution is typically 1.4-5.1% by weight. In step 240, the final solution is pumped through a filtration unit (which is optional) and either used on-site as an intermediate in the production of another polymer or stored/packaged for commercial sale. FIG. 3 shows a reaction vessel arrangement 300 where the first set of components 310 are added 315 to a reaction vessel 320 and stirred with a stirrer 322. Reaction vessel 320 is also heated. The reaction mixture is then pumped through pump 330 into a dilution vessel 340 where a second set of components 350 are added 355 to the vessel 340. The mixture is stirred using a stirrer 342 and then pumped through a second pump 360 through a filtration unit 370 and then to storage, on-site use, or packaging for commercial distribution 380. Table 2 shows contemplated constituent amounts that may be utilized in compositions described herein.

TABLE 2

| | |
|---|---|
| Ethanol | 5.76-20.12% (weight percent) |
| PGMEA | 2.88-10.05% |
| Tetraethoxysilane (TEOS) | 3.20-11.18% |
| Vinyltriethoxysilane (VTEOS) | 0.54-1.91% |
| Phenyltriethoxysilane (PTEOS) | 0.23-0.80% |
| Water | 1.81-6.34% |
| 0.1N nitric acid | 0.11-0.38% |
| butanol | 0.85-2.96% |
| PGMEA (second addition) | 46.20-84.6% |
| 1% tetramethylammoniumnitrate (TMAN) | 0.69-0.20% |
| 5N nitric acid | 0.07-0.02% |

Applications

The coating materials and solutions disclosed herein are generally considered to be applicably in tri-layer applications, tri-layer structures and/or tri-layer patterning processes. Tri-layer structures are also contemplated herein that comprise an organic underlayer (first layer), antireflective compositions and/or films contemplated herein (second layer) and a photoresist material (third layer) that are coupled to one another. Contemplated coatings, compositions and solutions may be applied to various substrates and/or surfaces to form sacrificial layers, layered materials, layers used in semiconductor processing, or layers used in electronic components, depending on the to specific fabrication process, typically by conventional spin-on deposition techniques, vapor deposition or chemical vapor deposition. These techniques include a dispense spin, a thickness spin, and thermal bake steps, to produce an inorganic coating. Typical processes include a thickness spin of between 1000 and 4000 rpm for about 20 seconds and one to three bake steps at temperatures between 80° C. and 300° C. for about one minute each. Contemplated inorganic coatings exhibit refractive indices between about 1.3 and about 2.0 and extinction coefficients greater than approximately 0.03.

Substrates contemplated herein may comprise any desirable substantially solid material. Particularly desirable substrate layers would comprise films, glass, ceramic, plastic, metal or coated metal, or composite material. In some embodiments, the substrate comprises a silicon or germanium arsenide die or wafer surface, a packaging surface such as found in a copper, silver, nickel or gold plated leadframe, a copper surface such as found in a circuit board or package interconnect trace, a via-wall or stiffener interface ("copper" includes considerations of bare copper and its oxides), a polymer-based packaging or board interface such as found in a polyimide-based flex package, lead or other metal alloy solder ball surface, glass and polymers such as polyimide. In other embodiments, the substrate comprises a material common in the packaging and circuit board industries such as silicon, copper, glass, and another polymer. In yet other embodiments, the substrate comprises a material commonly used for "front end of line" (FEOL), such as gate poly patterning, and "back end of line" (BEOL) packaging, such as via or metal interconnect patterning.

Contemplated coating materials, coating solutions and films can be utilized are useful in the fabrication of a variety of electronic devices, micro-electronic devices, particularly semiconductor integrated circuits and various layered materials for electronic and semiconductor components, including hardmask layers, dielectric layers, etch stop layers and buried etch stop layers. These coating materials, coating solutions and films are quite compatible with other materials that might be used for layered materials and devices, such as adamantane-based compounds, diamantane-based compounds, silicon-core compounds, novolac materials and dielectrics, organic dielectrics, and nanoporous dielectrics. Compounds that are considerably compatible with the coating materials, coating solutions and films contemplated herein are disclosed in PCT Application PCT/US01/32569 filed Oct. 17, 2001; PCT Application PCT/US01/50812 filed Dec. 31, 2001; U.S. application Ser. No. 09/538,276; U.S. application Ser. No. 09/544,504; U.S. application Ser. No. 09/587,851; U.S. Pat. Nos. 6,214,746; 6,171,687; 6,172,128; 6,156,812, U.S. Application Ser. No. 60/350,187 filed Jan. 15, 2002; and U.S. 60/347,195 filed Jan. 8, 2002 and U.S. Pat. No. 5,858,547, which are all incorporated herein by reference in their entirety.

The compounds, coatings, films, materials and the like described herein may be used to become a part of, form part of or form an electronic component and/or semiconductor component. As used herein, the term "electronic component" also means any device or part that can be used in a circuit to obtain some desired electrical action. Electronic components contemplated herein may be classified in many different ways, including classification into active components and passive components. Active components are electronic components capable of some dynamic function, such as amplification, oscillation, or signal control, which usually requires a power source for its operation. Examples are bipolar transistors, field-effect transistors, and integrated circuits. Passive components are electronic components that are static in operation, i.e., are ordinarily incapable of amplification or oscillation, and usually require no power for their characteristic operation. Examples are conventional resistors, capacitors, inductors, diodes, rectifiers and fuses.

Electronic components contemplated herein may also be classified as conductors, semiconductors, or insulators. Here, conductors are components that allow charge carriers (such as electrons) to move with ease among atoms as in an electric current. Examples of conductor components are circuit traces and vias comprising metals. Insulators are components where the function is substantially related to the ability of a material to be extremely resistant to conduction of current, such as a material employed to electrically separate other components, while semiconductors are components having a function that is substantially related to the ability of a material to conduct current with a natural resistivity between conductors and insulators. Examples of semiconductor components are transistors, diodes, some lasers, rectifiers, thyristors and photosensors.

Electronic components contemplated herein may also be classified as power sources or power consumers. Power source components are typically used to power other components, and include batteries, capacitors, coils, and fuel cells. Power consuming components include resistors, transistors, integrated circuits (ICs), sensors, and the like.

Still further, electronic components contemplated herein may also be classified as discreet or integrated. Discreet components are devices that offer one particular electrical property concentrated at one place in a circuit. Examples are resistors, capacitors, diodes, and transistors. Integrated components are combinations of components that that can provide multiple electrical properties at one place in a circuit. Examples are integrated circuits in which multiple components and connecting traces are combined to perform multiple or complex functions such as logic.

EXAMPLES

Example 1

Preparation of Antireflective Compositions
(UVAS-A Formulation)

To the solvents of 480 g ethanol and 240 g PGMEA, the monomers of 266.62 g TEOS, 45.67 g VTEOS and 19.23 g PTEOS are individually added. While stirring a mixture of 9.04 g 0.1N nitric acid and 151.36 g water was poured, the reaction mixture was heated to reflux for 4 hours at 81° C. before cooling down for adding 70.72 g butanol and stirring at RT overnight. The polymer in solvents was diluted with 1884 g PGMEA, followed by adding 16.5 g of 1% TMAN (condensation catalyst) and 1.77 g 5N nitric acid. The target final formulation thickness determined at a 1500 rpm spin rate is adjusted through the amount of PGMEA added during the dilution step. The solution was filtered to obtain final product. The final solution is pumped through a filtration unit (which is optional) and either used on-site as intermediate in the production of another polymer or stored/packaged for commercial sale.

The polymer with the molecule weight of Mn~1300 amu and Mw~2000 amu, which were analyzed by Waters Alliance GPC System equipped with 2690 Separations Module, 2410 RI detector, column oven, and a set of three PL gel (from Polymer Laboratories) individual pore size columns (100 nm, 50 nm and 10 nm) containing highly cross-linked spherical polystyrene/divinyl-benzene matrix, THF as mobile phase at the flow rate of 1.0 ml/minute.

The solution consists of 3.66% solid and 4.29% water, 27.19% ethanol, 2.03% butanol and 66.19% PGMEA analyzed by HP 6890 GC System with a column (320 µm ID×60 m×1 µm film thickness) filled with Restek RTX-200) and utilized thermo-conductivity detector (TCD) at the temperature program 40° C. as initial, ramp up 20° C./minute to 300° C. The product was spun, the film was baked for thickness of 80 nm (n@193 nm=1.70, k@193 nm=0.15, checked by 1200 n&k analyzer; wet etch rate 17 A/minute with 500:1 of DHF; dry etch rate 3390 A/minute with oxide recipe of fluorocarbon etch process (The fluorocarbon etch recipe is: pressure=45 mT, power=1500 W, etchant gas flows=C4F8/CO/Ar/O2=10/50/200/5 (sccm)) and 150 A/minute with N2+O2 etch recipe (N2+O2 recipe: pressure=20 mT, power=1000 W, O2/N2: 30 sccm/120 sccm, time=30 sec) at the plasma etch tool TEL Unity 2). Both fluorocarbon etch and N2+O2 etch are done using the TEL Unity 2 etch tool.

Table 3 shows product information related to those components in the examples and in Table 2, as mentioned earlier.

TABLE 3

| Materials | Vendors |
|---|---|
| Ethanol | Pharmco-AAPER (99.5% Ethanol + 0.5% Toluene) |
| PGMEA | General Chemical (Exceeds ACS grade) |
| TEOS | Honeywell |
| VTEOS | Gelest, Inc or Aldrich Chemical |
| PTEOS | Ultra Pure Solution, Inc |
| Water | D.I water In house |
| 0.1N nitric acid | Made in house with 70% nitric acid from General Chemicals |
| Butanol | Burdich & Jackson (ULSI grade) |
| PGMEA | same above |
| 1% TMAN | Made in house with 96% TMAN from Aldrich Chemicals |
| acetic acid | General Chemicals |
| 5N nitric acid | Made in house with 70% nitric acid from General Chemicals |
| DHF 500:1 | Diluted in house from 49% HF manufactured by General Chem. |
| THF | Burdich & Jackson |
| choline hydroxide | Aldrich |
| TMAF | Aldrich |
| Betain | Fluka |
| 5F-PTEOS | Gelest |
| Ben-TEOS | Gelest |
| NCS-TEOS | Gelest |
| DEPE-TEOS | Gelest |

Figure 4:
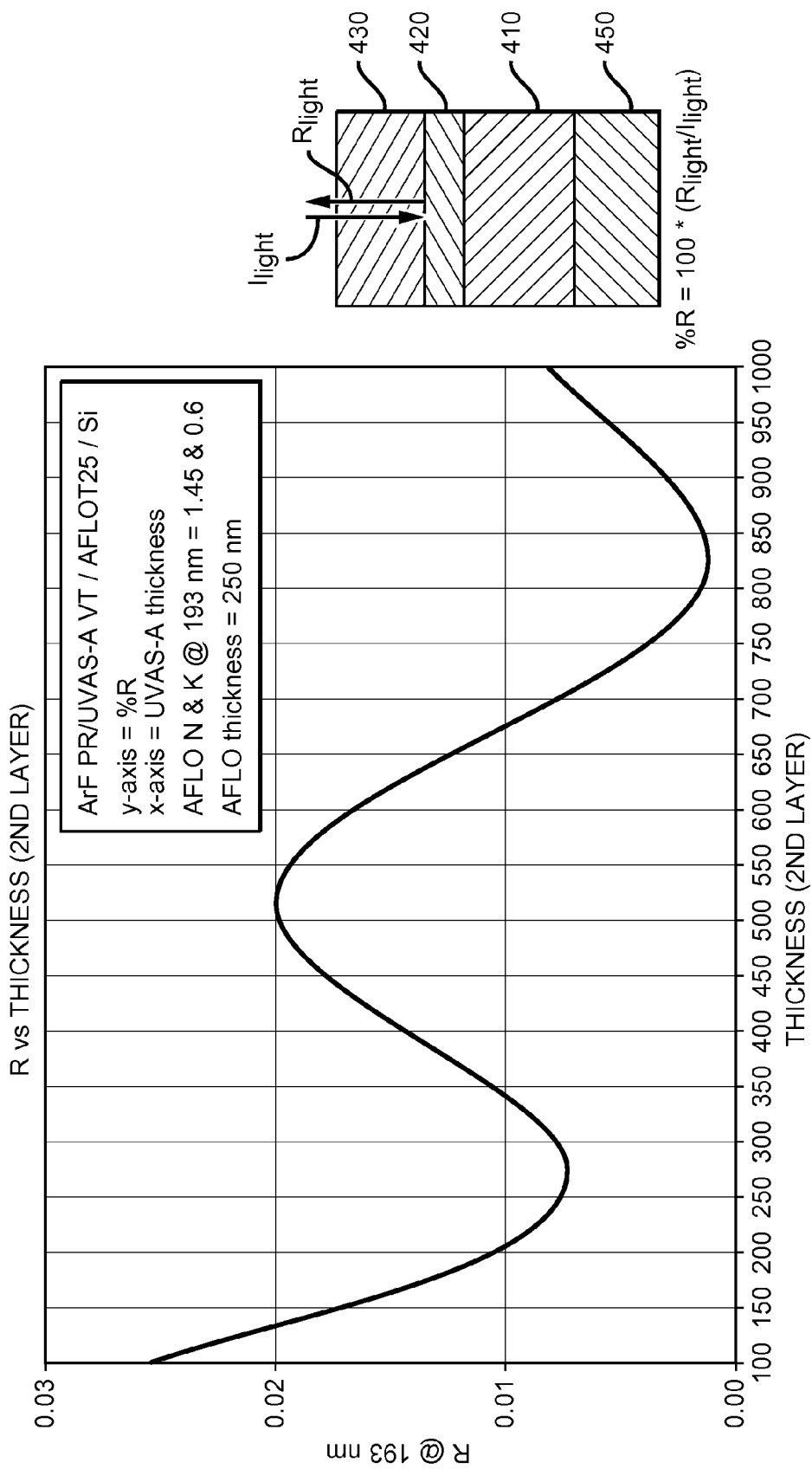
FIG. 4 shows simulated reflectance data, which is collected from a tri-layer component comprising a novolac resin as the organic underlayer.

Simulated reflectance data (% R) at 193 nm for a multi-layer patterning system (dual BARC) is found in FIG. 4, which is collected from a tri-layer component comprising a novolac resin as the organic underlayer. The tri-layer component, in this embodiment, comprises a silicon layer 450, a novolac-based polymer layer 410 (such as ACCUFLO from Honeywell International Inc) having a thickness of about 250 nm, a UVAS coating material as contemplated herein 420 having a variable thickness (100 Å to 1000 Å) and an ArF photoresist 430. Optical properties at 193 nm were found to be: UVAS (n=1.7 and k=1.4); novolac (n=1.45 and k=0.6); photoresist (n=1.7 and k is zero). The n and k simulation is normal incident light only with non-polarized light. The simulation assumes an infinity thick ArF photoresist.

It should be noted for the purposes of this disclosure that the n and k measurement technique used is not exact. For the purpose of this disclosure, the results are adequate as the appropriate trends are observed. A detailed thickness study may be required utilizing what is termed a dual-reflectance fitting algorithm across two different thickness values, which is a more lengthy process. All of the results reported within this disclosure are from what is termed a singe reflectance algorithm which by nature of the technique is less precise. Variations up to 0.04 in both the n and k values should be expected with a single reflectance algorithm.

Example 2

Shelf Life Studies of Contemplated Compositions

After production the product from Example 1 was checked with standard procedure of solution QC (by GPC for molecule weight, GC for liquid components and Liquid Partical Counter for the particits) and film QC (by Thermowave for thickness and by DHF for wet etch rate). The product QC data were considered at aging day-0. The material was then aged at either room temperature or 5° C. in unopened new bottles. The aged material was then checked with same QC procedure at day-15, day-30, etc. to see the changing of QC items in aging days.

Figure 5:
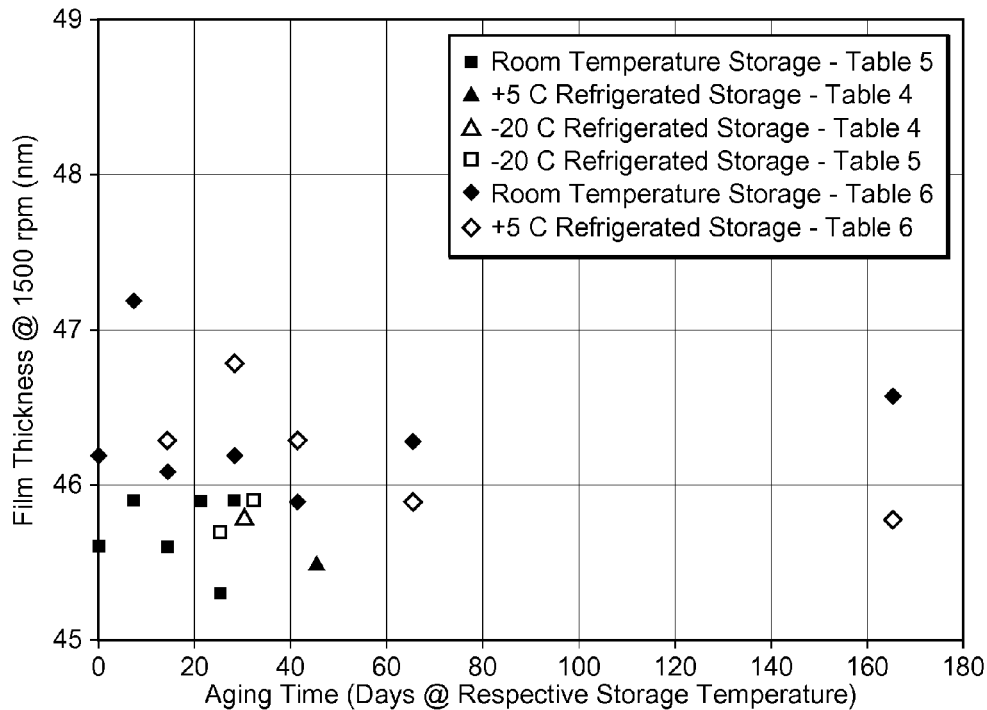
FIG. 5 shows aging time versus film thickness for contemplated films.
Figure 6:
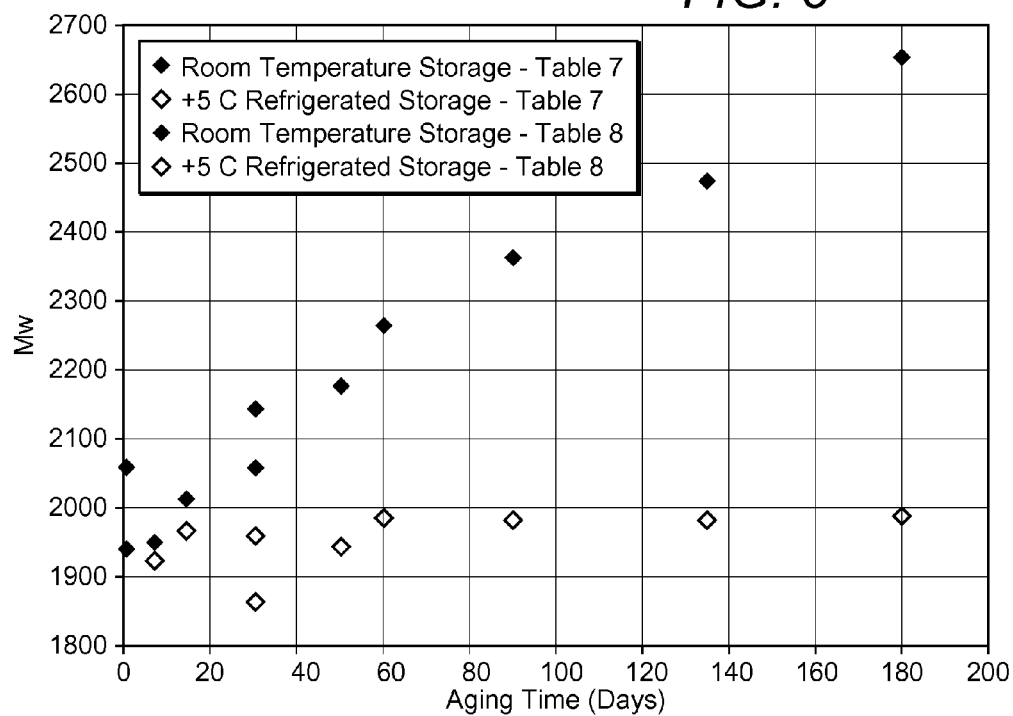
FIG. 6 shows aging time versus molecular weight for contemplated compositions.

FIGS. 5-7 (FIG. 5 are A45 and FIGS. 6-7 are A80) show data collected from shelf life studies of contemplated compositions disclosed herein. For reference, UVAS A45 is from the UVAS-A formulation found in Example 1 and Tables 4-6 having a thickness of 45 nm deposited at a spin-on rate of 1500 RPM and UVAS A80 is from the UVAS-A formulation found in Example 1 and Tables 7-8 having a thickness of 80 nm deposited at a spin-on rate of 1500 RPM.

Example 3

Reduced N&K at 193 Nm

To the solvents of 30 g ethanol and 15 g PGMEA, 17.18 g TEOS, 2.85 g VTEOS and 0.61 g PTEOS monomers were individually added. While stirring a mixture of 0.57 g 0.1N nitric acid and 6.76 g water was poured, the reaction mixture was heated to reflux at 81° C. for 4 hours before cooling down. 4.42 g butanol was added and the mixture was stirred at room temperature overnight. The resulting polymer was analyzed by the same GPC method as that in sample 1 and had a molecular weight of Mn=996 amu, Mw=1359 amu.

5.21 g of the above solution was diluted with 16.15 g of PGMEA, the material was spun, the film was baked. The film thickness was measured to be 78 nm with n@193 nm=1.6632, k@193 nm-0.0824 (checked with the same n&k tool as in Example 1).

Example 4

Reduction of Silicon % Down to 35% by Weight

To the solvents of 480 g ethanol and 240 g PGMEA, 89.99 g TEOS, 197.92 g VTEOS and 30.77 g PTEOS monomers were individually added. While stirring a mixture of 9.04 g 0.1N nitric acid and 151.36 g water was poured, the reaction mixture was heated to reflux at 81° C. for 4 hours before cooling down. 70.72 g butanol was added and the mixture was stirred at room temperature overnight. (the polymer with Mn=745 amu, Mw-929 amu analyzed by the same GPC system as mentioned in previous examples). 743.6 g of the solution above was diluted with 1115.4 g PGMEA, followed by adding a condensation catalyst of 9.33 g 1% TMAN and 1.03 g 5N nitric acid. The diluted solution was filtered to collect the final product. After spin and bake the film was measured to have a thickness of 70 nm and a wet etch rate was 1 A/minute in DHF 500:1. The plasma etch rate was 1394 A/minute with an oxide recipe and 300 A/minute with a N2+O2 etch recipe at the same tool as used above in other examples.

Example 5

System Designed to Absorb at 248 Nm and 365 Nm

In a 1-liter flask 297 grams 2-propanol, 148 grams acetone, 123 grams TEOS, 77 grams MTEOS, 60 grams 9-anthracene carboxy-methyl triethoxysilane, 0.6 grams 0.1 M nitric acid and 72 grams deionized water were combined. The flask was refluxed for 4 hours. To the solution, 115 grams of butanol, 488 grams 2-propanol, 245 grams of acetone, 329 grams of ethanol and 53 grams deionized water were added. The solution was filtered. The solution was dispensed, followed by a 3000 rpm thickness spin for 20 seconds, and baked at 80° C. and at 180° C. for one minute each. The final polymer has a molecular weight of Mw=1200 amu. Optical properties were measured using the same as in Example 1. The film thickness was 1635 Å. At 248 nm, the refractive index (n) was 1.373 and the extinction coefficient (k) was 0.268. In addition, TESAC also has an absorption of 365 nm and at the loading stated in this example, the n&k values at 365 nm are 1.55 and 0.06 respectively. The extinction coefficient at 248 nm and 365 nm can be lowered/increased by reducing/increasing the amount of TESAC (9-anthracene carboxy-methyl triethoxysilane) added.

Example 6

To Decrease N&K by Replacing PTEOS with 5F-PTEOS

To the solvents of 30 g ethanol and 15 g PGMEA, 17.23 g TEOS, 2.85 g VTEOS and 0.76 g pentafluorophenyltriethoxysilane (5F-PTEOS) monomers were individually added. While stirring a mixture of 0.57 g 0.1N nitric acid and 6.76 g water was poured, the reaction mixture was heated to reflux at 81° C. for 4 hours before cooling down. 4.42 g butanol was added and the mixture was stirred at room temperature overnight. The resulting polymer has a molecular weight of Mn=984 amu, Mw=1372 amu analyzed by the same GPC system as mentioned in earlier examples. The polymer in the solvent mixture was diluted with 218 g of PGMEA, the solution was spun, the film was baked and had a measured thickness of 53 nm (n@193 nm=1.61; k@193 nm=0.03 by the same n&k tool above).

Example 7

Non-PTEOS Containing (TEOS/VTEOS Only)

To the solvents of 30 g ethanol and 15 g PGMEA the monomers of 16.66 g TEOS, 3.81 g VTEOS only were individually added. While stirring a mixture of 0.57 g 0.1N nitric acid and 6.76 g water was added, the reaction mixture was heated to reflux at 81° C. for 4 hours before cooling down for adding 4.42 g butanol and stirring at room temperature overnight. (the polymer was analyzed and shown to have molecular weights of Mn 1021 amu and Mw 1349 amu by the same GPC system above).

8.18 g of the solution above was diluted with 13.9 g of PGMEA. The diluted solution was spun, the film was baked for the thickness of 70 nm (n@193 nm=1.62; k@193 nm=0.03 by the same n&k tool above)

Example 8

Transparent Systems (TEOS Only) with Adjusted Water Content

In this example, TEOS is used, along with incorporating a high water content was used to increase the crosslink density. Two contemplated compositions (low water and increased water) were produced, and the difference between the two compositions was the amount of water utilized, as shown in Table 9 (low water composition) and Table 10 (increased water composition) below:

TABLE 9

| | |
|---|---|
| IPA | 445.560 |
| TEOS | 243.425 |
| 0.1M Nitric Acid | 5.599 |
| DI Water | 66.860 |
| Total wt silanes | 243.425 |
| Total wt | 761.444 |

TABLE 10

| | |
|---|---|
| IPA | 445.560 |
| TEOS | 243.425 |
| 0.1M Nitric Acid | 5.599 |
| DI Water | 120.348 |
| Total wt silanes | 243.425 |
| Total wt | 814.932 |

The low water composition is prepared as follows:

To the solvent of 445.56 g IPA, the monomer of 243.425 g TEOS (or other monomers at certain ratio) is added. While stirring a mixture of 5.599 g 0.1N nitric acid and 66.86 g water, the reaction mixture was heated to 50° C. for 4 hours before cooling down and stirring at RT overnight. The polymer in solvents was diluted with 2284.332 g ethanol: 2-heptanone (70:30 mix). This produced a low pH product (pH~2.5). For a higher pH (pH~4) product, it was manufactured by adding 0.1056 g of aminopropyl TEOS (APTEOS) (base). The solution was filtered to obtain final product. The final solution is pumped through a filtration unit (which is optional) and either used on-site as an intermediate in the production of another polymer or stored/packaged for commercial sale. (Analysis: solid contain 3.02%; 1.35% water, 60.38% ethanol, 14.08% IPA and 21.18% 2-Heptanone by GC) For this composition, the n was measured at 1.50 and k was measured at 0. For a film baked at 250° C., the wet etch rate or WER for a 500:1 BOE, as shown in Angstroms/minute, was measured as 3760. The PTEOS oxide wet etch rate was 30 Angstroms/minute. Molecular weights of Mn 1303 amu and Mw 1809 amu were determined by the same GPC system as mentioned earlier.

The high water composition is prepared as follows:

To the solvent of 445.56 g IPA, the monomer of 243.425 g TEOS (or other monomers at certain ratio) is added. While stirring a mixture of 5.599 g 0.1N nitric acid and 120.348 g water, the reaction mixture was heated to 50° C. for 4 hours before cooling down and stirring at RT overnight. The polymer in solvents was diluted with 1214.248 g ethanol: 2-heptanone (70:30 mix). This produced a low pH product (pH~2.5). For a higher pH (pH~4) product, it was manufactured by adding 0.0912 g of APTEOS (base). The solution was filtered to obtain final product. The final solution is pumped through a filtration unit (which is optional) and either used on-site as an intermediate in the production of another polymer or stored/packaged for commercial sale. (Analysis: solid contain 4.07%; 4.39% water, 54.91% ethanol, 22.39% IPA and 14.24% 2-heptanone by GC) For this composition, the n was measured at 1.54 and k was measured at 0. For a film baked at 250° C., the wet etch rate or WER for a 500:1 BOE, as shown in Angstroms/minute, was measured as 300. The PTEOS oxide wet etch rate was 30 Angstroms/minute. Molecular weights of Mn 2050 amu and Mw 3362 amu were determined by the same GPC system as mentioned earlier.

In this example, the components come from the following sources:

| Components | Vendors |
|---|---|
| IPA | Ultrapure |
| TEOS | Honeywell |
| Water | D.I water In house |
| 0.1N nitric acid | Made in house with 70% nitric acid from General Chemicals |
| Ethanol | Pharmco-AAPER (99.5% Ethanol + 0.5% Toluene) |
| 2-Heptanone | Aldrich |
| APTEOS | Aldrich |

In both cases to increase the pH to ~4 to further increase cross-linking density, APTEOS was added. In the "less" or "low" water composition, 438 ppm of APTEOS was added. In the "high" or "more" water composition, 375 ppm APTEOS was added. Versions without any added APTEOS are referred to as "pH 2.5" in Table 11. Note that for a silicate only system the film is transparent (i.e. k=0). As shown in Table 11, the compositions with more or increased water content provided greatly reduced plasma etch rates. PTEOS oxide plasma etch rates were 2.91 Angstroms/second. The etch recipe utilized for this etch data was 20 mTorr, 1000 W, $N_2/O_2$=120/30 sccm.

TABLE 11

| FILM | ETCH TIME (SEC) | TH. PRE-ETCH (Å) | TH. POST-ETCH (Å) | ETCH RATE (Å/MIN) | ETCH RATE (Å/SEC) | NONUNI. PRE-ETCH (%) | NONUNI. POST-ETCH (%) |
|---|---|---|---|---|---|---|---|
| Less Water pH = 2.5 | 15 | 833 | 739 | 373.98 | 6.23 | 0.97 | 0.98 |
| Less Water pH = 4 | 15 | 812 | 733 | 316.57 | 5.28 | 0.97 | 0.98 |
| More Water pH = 2.5 | 15 | 797 | 757 | 159.57 | 2.66 | 0.97 | 0.98 |
| More Water pH = 4 | 15 | 826 | 781 | 178.26 | 2.97 | 0.97 | 0.87 |

Example 9

System with No VTEOS, Contains Only PTEOS and TEOS

To the solvents of 600 g ethanol and 300 g PGMEA, 395.77 g TEOS, and 24.04 g PTEOS monomers were individually added. While stirring a mixture of 11.3 g 0.1N nitric acid and 189.2 g water was poured, the reaction mixture was heated to reflux at 81° C. for 4 hours before cooling down. 88.4 g butanol was added and the mixture was stirred at room temperature overnight. The resulting polymer had a molecular weight of Mn=1828 amu, Mw=3764 amu, which was analyzed by the same GPC system above.

1635 g of the polymer solution was diluted with 6865 g PGMEA, followed by adding 21.34 g 1% TMAN (condensation catalyst) and 2.0 g 5N nitric acid. The diluted solution was filtered to collect the final product. After spin and bake the film had a thickness of 31 nm and wet etch rate was 63 A/minute in DHF 500:1.

Example 10

Different Condensation Catalysts

To the solvents of 480 g ethanol and 240 g PGMEA, 266.62 g TEOS, 45.67 g VTEOS and 19.23 g PTEOS monomers (or other monomers at specific ratios) were individually added. While stirring a mixture of 9.04 g 0.1N nitric acid and 151.36 g water was poured, the reaction mixture was heated to reflux at 81° C. for 4 hours before cooling down. 70.72 g butanol was added to the reaction mixture and stirred at room temperature overnight. The resulting polymer was measured to have a molecular weight of Mn=1153 amu, Mw=1802 amu, which was analyzed by the same GPC system above.
  A) To 40 g of the polymer solution, 58.8 g PGMEA, the catalyst, 0.46 g of 0.45% choline hydroxide in water and 0.5 g acetic acid were added for final product. (the polymer with Mn=1073, Mw-1768 analyzed by the same GPC system above). The solution was filtered and spun, the film was baked for the thickness of 73 nm and wet etch rate was 82 A/minute in 500:1 of DHF, plasma etch rate 203 A/minute with N2+O2 etch recipe at the same etch tool above.
  B) To 40 g of the polymer solution, 58.8 g PGMEA, the catalyst, 0.08 g of 2.5% tetramethylammoniumformate (TMAF) in water and 0.5 g acetic acid were added for final product. (the polymer with Mn=1112, Mw=1805 analyzed by the same GPC system above) The solution was filtered and spun, the film was baked for the thickness of 74 nm and wet etch rate was 71 A/minute in 500:1 of DHF, plasma etch rate 209 A/minute with N2+O2 etch recipe at the same etch tool above.
  C) To 40 g of the polymer solution, 58.8 g PGMEA, the catalyst, 0.21 g of 1% betain in water and 0.5 g acetic acid were added for final product. (the polymer with Mn=1120, Mw=1789 analyzed by the same GPC system above) The solution was filtered and spun, the film was baked for the thickness of 74 nm and wet etch rate was 85 A/minute in 500:1 of DHF, plasma etch rate 215 A/minute with N2+O2 etch recipe at the same etch tool above.

Example 11

Replace PTEOS with Benzyltriethoxysilane (Ben-TEOS)

To the solvents of 30 g ethanol and 15 g PGMEA, 17.23 g TEOS, 2.85 g VTEOS and 0.59 g Ben-TEOS monomers were individually added. While stirring a mixture of 0.57 g 0.1N nitric acid and 6.76 g water was poured, the reaction mixture was heated to reflux at 81° C. for 4 hours before cooling down. 4.42 g butanol was added and the mixture was stirred at room temperature overnight. The resulting polymer had a molecular weight of Mn=956 amu, Mw=1386 amu, which was analyzed by the same GPC system above). The polymer in the solvent mixture was diluted with 123 g of PGMEA, the solution was spun, the film was baked and measured to have a thickness of 81 nm (n=@193 nm 1.63; k@193 nm=0.08 by the same n&k tool above).

Example 12

Decrease N&K by Introducing Thiocyanapropyltriethoxysilane (NCS-TEOS)

To the solvents of 30 g ethanol and 15 g PGMEA, 16.46 g TEOS, 2.85 g VTEOS, 0.72 g PTEOS monomers were individually added along with 0.79 g NCS-TEOS. While stirring a mixture of 0.57 g 0.1N nitric acid and 6.76 g water was poured, the reaction mixture was heated to reflux at 81° C. for 4 hours before cooling down. 4.42 g butanol was added and the mixture was stirred at room temperature overnight. The resulting polymer had a molecular weight of Mn=900 amu, Mw=1300 amu, which was analyzed by the same GPC system above. The polymer in the solvent mixture was diluted with 123 g of PGMEA the solution was spun, the film was baked and shown to have a thickness of 85 nm (n@ 193 nm=1.65; k@ 193 nm=0.09 by the same n&k tool above).

Example 13

To Decrease N&K by Using Diethylphosphotoethyltriethoxysilane (DEPE-TEOS)

To the solvents of 30 g ethanol and 15 g PGMEA, 16.25 g TEOS, 2.85 g VTEOS, 0.962 g PTEOS and 0.99 g DEPE-TEOS monomers were individually added. While stirring a mixture of 0.57 g 0.1N nitric acid and 6.76 g water was poured, the reaction mixture was heated to reflux at 81° C. for 4 hours before cooling down. 4.42 g butanol was added and the mixture was stirred at room temperature overnight. The resulting polymer had a molecular weight of Mn 925 amu, Mw=135 amu analyzed by the same GPC system above. The polymer in the solvent mixture was diluted with 122 g of PGMEA, the solution was spun, the film was baked and shown to have a thickness of 85 nm (n@193 nm=1.60; k@193 nm=0.10 by the same n&k tool above).

Example 14

Reduction in TMAN Content

To the solvents of 60 g ethanol and 30 g PGMEA, 33.33 g TEOS, 5.71 g VTEOS and 2.40 g PTEOS monomers were individually added. While stirring a mixture of 1.13 g 0.1N nitric acid and 18.92 g water was poured, the reaction mixture was heated to reflux at 81° C. for 4 hours before cooling down. 8.84 g butanol was added to the reaction mixture and stirred at room temperature overnight. The resulting polymer was measured to have a molecular weight of Mn=1121 amu, Mw=1723 amu analyzed using the same GPC system as mentioned above.
  Option 1:
    To 17.94 g of the polymer solution, 26.01 g PGMEA, 0.153 g of 1% TMAN in water solution, 0.09 g of 1N nitric acid were added for final product. The molecular weights of the polymer was measured to be Mn=1112 amu and Mw=1717 amu using the same GPC system as described above. The solution was filtered and spun onto a Si wafer to form a film. The film was baked at 250° C. for 90 s resulting in a thickness of 82 nm (n@193 nm=1.6608; k@193 nm=0.1310). The films' 500:1 DHF wet etch rate was 12 Å/minute. Its plasma etch rate was 3127 Å/minute using the previously defined fluorocarbon etch process etch recipe.

Option 2:

To 17.85 g of the polymer solution, 25.88 g PGMEA, 0.076 g of 1% TMAN in water solution, 0.041 g of 1N nitric acid were added for final product. The molecular weights of the polymer was measured to be Mn=1112 amu and Mw=1735 amu using the same GPC system as described above. The solution was filtered and spun onto a Si wafer to form a film. The film was baked at 250° C. for 90 s resulting in a thickness of 84 nm (n@193 nm=1.6665; k@193 nm=0.1460). The films' 500:1 DHF wet etch rate was 10 Å/minute. Its plasma etch rate was 3114 Å/minute using the previously defined fluorocarbon etch process etch recipe.

Example 15

A Two Amine Salt System (TMAN and APTEOS-Triflate)

To the solvents of 60 g ethanol and 30 g PGMEA, 33.33 g TEOS, 5.71 g VTEOS and 2.40 g PTEOS monomers were individually added. While stirring a mixture of 1.13 g 0.1N nitric acid and 18.92 g water was poured, the reaction mixture was heated to reflux at 81° C. for 4 hours before cooling down. 8.84 g butanol was added to the reaction mixture and stirred at room temperature overnight. The resulting polymer was measured to have a molecular weight of Mn=1121 amu, Mw=1723 amu analyzed using the same GPC system as mentioned above. The APTEOS-triflate stock solution was freshly prepared from 4.89 g 20% triflic acid in water (Aldrich) and 1.425 g of APTEOS (APTEOS 22.6% by weight in the stock solution).

Option 1:

To 21.45 g of the polymer solution, 31.12 g PGMEA, 0.092 g of 1% TMAN in water solution, 0.049 g of 1N nitric acid and 0.0066 g APTEOS-triflate stock solution mentioned above were added for final product. The molecular weights of the polymer was measured to be Mn=1165 amu and Mw=1805 amu using the same GPC system as described above. The solution was filtered and spun onto a Si wafer to form a film. The film was baked at 250° C. for 90 s resulting in a thickness of 84 nm (n@193 nm=1.6764; k@193 nm=0.1600). The films' 500:1 DHF wet etch rate was 15 Å/minute. Its plasma etch rate was 3369 Å/minute using the previously defined fluorocarbon etch process etch recipe.

Option 2:

To 21.45 g of the polymer solution, 31.12 g PGMEA, 0.076 g of 1% TMAN in water solution, 0.041 g of 1N nitric acid and 0.0132 g APTEOS-triflate stock solution mentioned above were added for final product. The molecular weights of the polymer was measured to be Mn=1149 amu and Mw=1784 amu using the same GPC system as described above. The solution was filtered and spun onto a Si wafer to form a film. The film was baked at 250° C. for 90 s resulting in a thickness of 85 nm (n@193=1.6919; k@193=0.1876). The films' 500:1 DHF wet etch rate was 19 Å/minute. Its plasma etch rate was 3382 Å/minute using the previously defined fluorocarbon etch process etch recipe.

Example 16

Method of Use of UVAS in a Tri-Layer Patterning Stack

The substrate film or films to be patterned is first coated with a film of organic under layer (OUL) material. Deposition of OUL occurs using a typical film deposition process most typically being a spin coat process. The coated OUL film is then baked to a temperature ranging from 200-300° C. The OUL thickness is chosen to completely fill and planarize any topography that may exist. Typically the OUL thickness is on the order of 200 to 300 nm. Note that tri-layer patterning can be used in applications where substrate topography may or may not be present. Some basic OUL material properties are:

- high carbon to oxygen (C/O) composition ratio for improved critical dimension control during plasma etch
- absorbing @ target wavelength (k>0.25) refractive index @ target wavelength (n<1.7)
- mechanically strong and rigid so that line collapse does not occur after etch patterning
- easily etched and removed using an oxidizing or reducing plasma etch chemistry
- provides defect free fill and planarization of narrow, high aspect ratio features such as slots, holes, and spaces.
- thermally stable in that no condensate is out gassed during the subsequent films deposition processes Although novolac resins have been considered and used as an OUL material typically they have been shown to lack mechanical robustness and also have too low of a C/O ratio to be used for state-of-the art ArF patterning. An example of a commercially available OUL is HM8005 from JSR Inc. HM8005 is a naphthalene-based polymer system with a n & k @ 193 nm of 1.5 and 0.29 respectively. Its reported plasma etch rate relative to a novolac resin is 0.85.

Following deposition of the OUL film the next step in tri-layer patterning is to deposit the SiO$_2$ based UV absorbing middle layer film (UVAS) film. The material properties for contemplated embodiments of UVAS have already been described in this specification. The thickness of UVAS is selected based on the substrate reflectance and required plasma etch margin to the substrate films. Three UVAS formulations exist of differing final film thickness. All thickness values are measured at 1500 rpm spin coat for 30 s followed by a bake to 250° C. for 90 s.

UVAS-A25 (25 nm)—first reflectance minima for 193 nm incident light
UVAS-A45 (45 nm)—first reflectance maxima for 193 nm incident light
UVAS-A80 (80 nm)—second reflectance minima for 193 nm incident light UVAS is deposited directly onto the OUL film using a typical film deposition process most typically being a spin coat process. The thickness of UVAS is adjusted through changes in the spin speed. The UVAS film is then baked to a temperature between 200-250° C.

The final film deposition step for tri-layer patterning is deposition of the 193 nm absorbing photoresist (ArF PR). Typical ArF PR polymers are acrylate, methacrylate or generally organo-acrylate based polymer and co-polymer systems containing respective photoacid generators (PAGs) and quencher chemistries. Typically these ArF PRs are positive tone but can be negative tone as well. An extremely brief list of commercially available ArF PRs are: JSR AR2459J, JSR AR1863J, ShinEtsu SAIL-X123, and TOK P-6111. Each of the PR manufacturers offers a large selection of ArF PRs differing in exposure speed, end use application, etch resistance, and contrast. The PRs mentioned above only captures a sliver of what is available for use in the IC industry.

The ArF PR is deposited directly onto UVAS using a typical film deposition process most typically being a spin coat process. The thickness of the ArF PR is adjusted through changes in the spin speed. The ArF PR film is then baked to a temperature of approximately 90-130° C. Final ArF PR film thickness ranges from 250 nm to 100 nm depending on the application and dimensions to be patterned.

The film stack for tri-layer patterning is now complete. In the following steps, the ArF PR is illuminated by 193 nm light through a mask to expose the photoresist. The ArF PR is then baked and developed leaving behind patterned ArF PR features. The patterned dimensions of the ArF PR are then transferred using a plasma etch process first into the underlying UVAS film and then into the bottom OUL film using the respective plasma etch chemistries mentioned in the patent. The recipes presented are examples only as many variations exist in both the chemistries as well as the etch tool model and configuration.

During the etching of the OUL film the ArF PR is etched away thus making the UVAS film the plasma etch mask, receives direct exposure the plasma ion flux, during the OUL etch. Once the OUL etch is complete the pattern is now transferred into the substrate film(s). The plasma etch chemistry used to etch the substrate film or film stack depends on the type of substrate being etched. For example, etching $SiO_2$, Al, Si layers would all use a different type plasma etch chemistry. During the substrate etch the UVAS layer is removed thus now making the OUL the etch mask, the OUL receives direct exposure of the plasma ion flux. Once the pattern is transferred into the substrate film or film stack the OUL layer is removed using either a wet (selective wet etch chemistry) or dry (plasma, super critical $CO_2$) strip process. The patterned feature into the original ArF PR layer has now been successfully transferred into the substrate film or film stack and the patterned substrate film or film stack is now ready for the next manufacturing step.

Thus, specific embodiments and applications of compositions and methods to produce compositions, coatings and films for tri-layer applications, methods of productions and uses thereof have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

We claim:

1. A composition for use in tri-layer applications, the composition having a matrix and comprising:
   a formulated polymer comprising at least one type of silicon-based moiety forming the matrix of the polymer, a plurality of vinyl groups substituent to the matrix of the polymer, and a plurality of phenyl groups substituent to the matrix of the polymer,
   at least one heat-activated condensation catalyst, and
   at least one solvent, wherein a cured film formed from the composition has a high etch selectivity as compared with an adjacent film.

2. The composition of claim 1, wherein the at least one type of silicon-based moiety comprises at least one high ratio inorganic compound, at least one absorbing compound, at least one adhesion promoter or a combination thereof.

3. The composition of claim 1, wherein the at least one type of silicon-based moiety comprises at least one alkoxy moiety.

4. The composition of claim 3, wherein the at least one alkoxy moiety comprise tetraethoxysilane, phenyltriethoxysilane, vinyltriethoxysilane or a combination thereof.

5. The composition of claim 1, wherein the polymer comprises at least 30 weight percent of silicon.

6. The composition of claim 5, wherein the polymer comprises at least 40 weight percent of silicon.

7. The composition of claim 1, wherein at least part of the plurality of vinyl groups come from vinyltriethoxysilane.

8. The composition of claim 1, wherein at least part of the plurality of phenyl groups come from phenyltriethoxysilane.

9. The composition of claim 1, further comprising at least one additional adhesion promoter.

10. The composition of claim 1, further comprising at least one absorbing compound.

11. The composition of claim 9, wherein the at least one additional adhesion promoter comprises a base.

12. The composition of claim 11, wherein the at least one adhesion promoter comprises nitrogen.

13. The composition of claim 11, wherein the at least one adhesion promoter comprises phosphorus.

14. The composition of claim 12, wherein the at least one adhesion promoter comprises an amine base.

15. The composition of claim 14, wherein the at least one adhesion promoter comprises ammonium, pyridine, aniline, TMAH, CTAH, TBAH, APTEOS or a combination thereof.

16. The composition of claim 12, wherein the at least one adhesion promoter comprises at least one amine salt.

17. The composition of claim 16, wherein the at least one amine salt comprises a weak acid/strong base or a strong acid/weak base.

18. The composition of claim 11, the at least one adhesion promoter comprises a neutral compound.

19. The composition of claim 11, wherein the at least one condensation catalyst comprises at least one amine salt.

20. The composition of claim 19, wherein the at least one amine salt comprises TMAN.

21. The composition of claim 1, further comprising at least one pH modifier.

22. The composition of claim 21, wherein the at least one pH modifier comprises an acid.

23. The composition of claim 22, wherein the acid comprises nitric acid.

24. The composition of claim 1, wherein the at least one solvent comprises PGMEA, ethanol, butanol, water or a combination thereof.

* * * * *